US007015762B1

(12) United States Patent
Nicholls et al.

(10) Patent No.: US 7,015,762 B1
(45) Date of Patent: Mar. 21, 2006

(54) REFERENCE TIMING SIGNAL APPARATUS AND METHOD

(75) Inventors: Charles Nicholls, Nepean (CA); Philippe Wu, Nepean (CA); Gregory Carleton, Ottawa (CA); Steve Beaudin, Nepean (CA)

(73) Assignee: Nortel Networks Limited, St. Laurent (CA)

( * ) Notice: Subject to any disclaimer, the term of this patent is extended or adjusted under 35 U.S.C. 154(b) by 22 days.

(21) Appl. No.: 10/921,342

(22) Filed: Aug. 19, 2004

(51) Int. Cl.
*H03L 7/00* (2006.01)

(52) U.S. Cl. ............................ 331/10; 331/17; 331/18; 331/65; 331/66; 331/158; 375/376

(58) Field of Classification Search ............ 331/10–11, 331/14, 17–18, 25, 44, 65–66, 158; 375/376; 455/260
See application file for complete search history.

(56) References Cited

U.S. PATENT DOCUMENTS

| 5,144,595 | A | | 9/1992 | Graham et al. |
|---|---|---|---|---|
| 5,629,649 | A | * | 5/1997 | Ujiie ............................ 331/17 |
| 5,697,082 | A | | 12/1997 | Greer et al. |
| 6,081,163 | A | | 6/2000 | Ujiie et al. |
| 6,194,970 | B1 | | 2/2001 | Nielsen et al. |
| 6,711,230 | B1 | | 3/2004 | Nicholls et al. |

FOREIGN PATENT DOCUMENTS

EP          0615360          9/1994

OTHER PUBLICATIONS

Penrod, "Adaptive Temperature Compensation of GPS Disciplined Quartz and Rubidium Oscillations", *IEEE International Frequency Control Symposium*, 1996, pp. 980-987.

* cited by examiner

*Primary Examiner*—David Mis
(74) *Attorney, Agent, or Firm*—Jeffrey M. Measures; Borden Ladner Gervais LLP

(57) ABSTRACT

A reference timing signal apparatus with a phase-locked loop (PLL) has a computer algorithm which adaptively models the multiple frequencies of an oscillator following a training period. The oscillator is part of a PLL and the oscillation frequency thereof is controlled in response to the phase detector output. The computer algorithm processes the control signal applied to the oscillator. The computer algorithm updates the characteristics of the model relating to the aging and temperature of the oscillator, using for example, a Kalman filter as an adaptive filter, in accordance with a cumulative phase error in the PLL calculated during a given time interval. By the algorithm, the subsequent model predicts the future frequency state of the oscillator on which it was trained. The predicted frequency of the model functions as a reference to correct the frequency of the oscillator in the event that no input reference timing signal is available. Also, the calculated phase error is stored and is used while no input reference timing signal or accurate predicted frequency value is available. With the model updating algorithm, oscillators of low stability performance may be used as cellular base station reference oscillator, which is based on satellite systems, for example, GPS, GLONASS or Galileo systems.

40 Claims, 12 Drawing Sheets

REFERENCE TIMING SIGNAL APPARATUS AND METHOD

FIELD OF THE INVENTION

The present invention relates to a reference timing signal apparatus and method for providing a timing output signal. The reference timing signal apparatus is applicable to a cellular telephone base station, for example. The present invention is also applicable to reference signal or clock signal generators in other types of apparatus, for example, optical transport networks.

BACKGROUND OF THE INVENTION

A known cellular telephone system is a Code Division Multiple Access (CDMA) system. The CDMA wireless phone system allows multiple cellular phone users to share the same frequency spectrum, and uses a generated noise carrier with a different and essentially orthogonal instance of the noise carrier assigned to each mobile unit within a cell. The base station receiver in a CDMA station correlates the received signal from a mobile unit with the desired noise carrier, extracting the transmitted digital signal with a sufficient signal-to-noise ratio to achieve a satisfactory data error rate.

In a system such as CDMA, the base stations must be synchronized with surrounding base stations to handle handoff of mobile phones between cells and for other functions. A time reference must be provided to each base station. This is commonly provided via Global Positioning System (GPS) receivers which comprise a part of each base station. GPS satellites each provide radio signals that are synchronized and usable by GPS receivers not only to derive one's physical position relative to the satellites but also to derive a very accurate time reference.

The GPS receiver antennas of cellular phone equipment are often placed high relative to surrounding terrain and they are subject to lightning damage in addition to physical damage from rough handling or other damage. CDMA base stations which lose contact with GPS satellites should ideally continue to operate during this holdover period until contact can be reestablished, whether through repair of damaged equipment, or other changed circumstances. A crystal oscillator may provide a time reference during this holdover period, as long as the oscillator is stable enough to keep the base station sufficiently synchronized with other base stations.

A method is needed for improving on the performance of current CDMA base station clock stability when the base station is not receiving a GPS signal to provide a clock reference. When no GPS signal is received the system clock operates in holdover mode, and the clock signal is generated by a crystal oscillator designed to provide a signal of the same frequency as is provided by the GPS receiver. It is necessary to improve current GPS-based clock stability during holdover by compensating for the performance of a crystal used to generate a clock signal during this holdover period.

A typical CDMA base station uses a received GPS signal to produce a reference clock signal to ensure that CDMA stations are synchronized in operation. Such synchronization between stations is important to the proper operation of a CDMA system, as common operations such as a CDMA spread spectrum code search and station-to-station handoff require that stations be closely synchronized in time. Mobile stations also synchronize to the signals provided by the base station, such that the GPS clock provides a timing reference for both the base station and all mobile stations active within the cell.

This synchronization is jeopardized when the base station fails to receive a GPS signal, and must rely on an oscillator to maintain time independent of the GPS signal still used by neighboring base stations. This commonly occurs as a result of lightning strikes that damage the GPS antenna or receiver of a CDMA system, and also occurs as a result of damage due to rough handling and vandalism or from other causes. If the oscillator is not sufficiently stable, the time it provides to the base station may drift with respect to the desired GPS reference time, and cause the base station to fail to communicate properly.

Currently, a new oven-controlled crystal oscillator (OCXO) used to provide a holdover clock signal in a CDMA system is burned in and tested in operation for frequency stability for no more than a few days. Crystals that perform adequately are then accepted for service and placed in use as part of a CDMA base station. But, because crystals often take from 20 to 30 days to settle in or become stable in performance, this test cannot ensure performance of the crystal in extended operation. Excessive frequency drift due to molecular settling or spurious frequency jumps due to contaminants in the crystal may cause the crystal to perform much more poorly in the field than these preliminary tests could indicate. Other factors such as rough handling during installation or spurious mechanical changes in the crystal may further degrade crystal stability, and are not detectable after initial testing.

In order to reduce base station cost, lower cost reference oscillator may be used. However, in general, the frequency stability of low cost OCXOs is poor and thus, the frequency stability in the holdover period is not reliable. It must be ensured that the increased frequency drift in the low cost OCXOs used as base station reference oscillators is compensated sufficiently to maintain the required level of base station synchronization.

A clock synchronizing circuit including a phase-lock circuit with a voltage controlled oscillator (VCO) and a temperature compensation circuit is disclosed in European Patent Publication No. 0615 360 A2 (Sep. 14, 1994). A frequency standard generator including a voltage controlled crystal oscillator (VCXO) that is phase-locked to a GPS satellite time signal is disclosed in U.S. Pat. No. 6,081,163 issued to Ujiue et al. on Jan. 27, 2000. Bruce M. Penrod "Adaptive Temperature Compensation of GPS Disciplined Quartz and Rubidium Oscillators", 1996 IEEE International Frequency Control Symposium, pp. 980–987, discloses that an algorithm for performing adaptive temperature and aging compensation of GPS disciplined oscillators.

U.S. Pat. No. 6,194,970 issued to Nielsen et al. on Feb. 27, 2001 discloses an oscillator stability monitoring and compensation system for analyzing the steering voltage applied to a crystal oscillator over time and compensating for spurious frequency jumps in determining the drift rate of a crystal oscillator. The steering voltage is used to estimate oscillator stability by comparing a projected steering voltage against an actual voltage after a simulated holdover period, or analyzing a steering voltage recorded over a period of time and evaluating rates of change. Spurious frequency jumps are removed from data collected while not in an actual holdover, making the data more accurately represent the frequency drift rate of the oscillator. The rate of occurrence of spurious frequency jumps while not in holdover may be monitored to provide information regarding the physical condition of the crystal. However, the system is directed to detect spurious frequency jumps in the crystal and compensate for these jumps in charactering the performance of the crystal. It does not address the problem of a low performance reference oscillator.

U.S. Pat. No. 5,697,082 issued to Greer et al. on Dec. 9, 1997 discloses a self-calibrating frequency standard system self-calibrating a clock of a communication terminal for use with communication systems in which a central communication node generates time base correction signals for the terminal clock includes a terminal oscillator which generates an oscillator frequency that includes an error amount. An oscillator calibration filter generates a frequency error estimate amount. The frequency error estimate amount generated by the calibration filter is subtracted from the oscillator frequency error amount. The time base correction signals are applied to the calibration filter to thereby modify the frequency error estimate amount generated by the calibration filter based upon the time base correction signals generated by the communication central node. It does not address the problem of low performance reference oscillator, either.

For example, in the North American synchronous CDMA, it is required to meet with all reference oscillator specifications with respect to the accumulated timing error over the holdover period. An example of specification for a compact base transceiver system (BTS) is 6.9 microseconds cumulative timing error in 24 hours, which translates to a frequency stability requirement of 0.08 parts per billion (ppb) on the 10 MHz reference oscillator. It is noted that the holdover specifications include all operating condition variations, the most severe of which from a crystal oscillator design standpoint, is the −5° C. to +70° C. ambient temperature range.

The simplest approach to the problem of determining the oscillator frequency when a more stable reference is unavailable is to avoid the requirement for doing so altogether. In order not to have to know the oscillator frequency during the holdover period, the problem is that one of ensuring the cumulative time error of the free running oscillator remains within the specified 6.9 microseconds. To achieve the required level of stability directly from the oscillator without recourse to any form of control loop places severe demands on the crystal cut and thermal stabilization through the use of double oven architectures. It is, thus, required to improve the oscillator long term stability with low cost. For example, rubidium oscillators and conventional double oven crystal oscillator are still expensive.

There are different satellite positioning systems other than the GPS system, for example, the Russian Global Navigation Satellite System (GLONASS), the European Galileo system, the proposed Chinese system.

For example, in Russia, any base stations require timing to be derived from the GLONASS based time reference. Modules and systems require accurate time synchronization to GLONASS time reference and resilience against intermittent access to the reference signal. At the present time, the active satellites in the GLONASS satellite constellation are seven and therefore, the intermittence of satellite visibility increased. In the systems reliant on the GLONASS constellation for its external time reference, the CDMA base station is required to be time synchronous with the network to within 6.921 microseconds over an eight hour period during which no external reference is present (i.e., the holdover). Also, such visibility concerns are applicable to the systems reliant on the other satellite positioning systems for the external time references.

SUMMARY OF THE INVENTION

It is an object of the present invention to provide improved reference timing signal apparatus and method for providing a timing output signal.

The present invention is directed to a reference timing signal apparatus for providing a timing output signal, in one aspect. The reference timing signal apparatus includes an oscillator and a difference detector. In the reference timing signal apparatus, the oscillator generates an oscillation output signal in response to a control component of an input control signal. The difference detector detects a difference corresponding to a time difference between the oscillation output signal and an input reference timing signal when the input reference timing signal is available. Provided is a difference signal having correction data which corresponds to the detected difference.

The reference timing signal apparatus also includes an error calculator and a processor. The error calculator calculates cumulative time error (CTE) in the difference signal over a given time period to provide a correction signal. The processor provides a frequency control value in accordance with the correction data and a frequency dependent element relating to the oscillator. The frequency dependent element is provided in accordance with a characteristic model that is updateable in accordance with the correction data when the input reference timing signal is available.

The reference timing signal apparatus further includes an oscillation controller. The oscillation controller controls the control component of the input control signal applied to the oscillator, in accordance with the correction data provided by the error calculator and the frequency control value provided by the processor.

For example, the error calculator calculates the CTE between the input reference timing signal and the oscillation output signal. The CTE is calculated through summation of the second by second phase error between the input reference timing signal and the oscillation output signal. The difference detector determines the time difference between the oscillation output signal and the input reference timing signal in terms of number of cycles of a frequency derived from multiplication of the oscillation frequency by a multiplication factor M (e.g., 16). The output of the difference detector is consequently in terms of number of counts of the multiplied frequency.

Advantageously, conversion of the count number to a time error is conducted in a correction value processor by multiplication of the difference detector's count value by the period of the multiplied frequency. For example, the frequency of the oscillation output signal is 10 MHz and the multiplied frequency is 160 MHz. It leads to a count multiplier of 6.25 ns. Hence, the difference detector's output of 10 counts corresponds to a time error of 62.5 ns.

The correction value processor provides a frequency control value in accordance with the calculated phase error and a frequency dependent element relating to the oscillator. The frequency dependent element is provided in accordance with a characteristic model that is updateable in accordance with the calculated phase error when the input reference timing signal is available.

For example, the error calculator calculates a cumulative time error (CTE) based on the second by second phase error provided by the phase detector. The CTE in conjunction with a moving average of past control values is produced every second and is used for oscillation control and updating the characteristic model.

Advantageously, the processor includes first and second processing units. The first processing unit provides a first characteristic signal in accordance with a first parameter of a first model included in the characteristic model. The first parameter relates to an aging characteristic of the oscillator. The first processing unit updates the first parameter in accordance with the calculated phase error when the input reference timing signal is available (e.g., a satellite locked mode) and in accordance with a past parameter when the input reference timing signal is unavailable (e.g., a holdover mode), respectively.

The second processing unit provides a second characteristic signal in accordance with a second parameter of a second model of the characteristic model. The second parameter relates to a temperature characteristic of the oscillator. The second processing unit updates the second parameter in accordance with the calculated phase error, the first characteristic signal, a temperature in relation to the oscillator, when the input reference timing signal is available. Also, the second processing unit updates the second parameter in accordance with a past parameter when the input reference timing signal is unavailable. The frequency control value is produced based on the updated first and second parameters.

The first and second characteristics are combined to produce the characteristic signal to vary the frequency of the oscillation output signal of the oscillator. Since the first and second parameter relates to frequency dependent elements on the frequency of the oscillator, with adaptively updating of the characteristic model, the frequency change to the oscillation signal over time is compensated.

The second processing unit may also update the second parameter in accordance with the calculated phase error, the first characteristic provided by the first processing unit, a temperature in relation to the oscillator and a voltage in relation to the oscillator. In this processing unit, the frequency of the oscillator is controlled in accordance with the voltage which may affect the oscillation. The temperature and voltage are obtained by their respective sensors implemented into the oscillator.

For example, while the satellite locked mode, the characteristic models are updated in accordance with the calculated phase error. The calculated phase error is stored and used for controlling the oscillation frequency during the holdover mode and while the characteristic models are not updated. During the holdover mode and while the characteristic models are updated, the characteristics of the updated models are used to control the oscillation frequency.

The reference timing signal apparatus may include a temperature sensor for sensing temperature in relation to the oscillator to provide a temperature signal to the second processing unit for updating the second parameter. The second processing unit may include an update distinction detector for detecting a distinction of the second parameter in accordance with the frequency of the oscillation output signal and the temperature in relation to the oscillator. The second parameter is positively or negatively updated in accordance with the detected distinction. Also, the second processing unit may include a voltage detector for detecting voltage in relation to the oscillator to provide a voltage signal to the second processing unit, the second processing unit updating the second parameter in accordance with the correction data, the first characteristic signal, the temperature and the voltage, when the input reference timing signal is available.

In a case where the reference timing signal apparatus is applied to a base station, for example, it improves current GPS-based clock stability during holdover by better estimating and compensating for the performance of a crystal used to generate a clock signal during the holdover period. Also, it improves the clock stability during holdover based in other satellite systems, e.g., GLONASS and Galileo.

Advantageously, the reference timing signal apparatus may include a training controller for controlling the training of the processor. After the reference timing signal apparatus is phase-locked, under control by the training controller, the processor is trained for a training period, provided applicability of the input reference timing signal. If the reference timing signal apparatus is applied to a base station in which the input reference timing signal is produced based on the GLONASS, the training period may be two hours to fully train the compensation algorithm of the processor. For example, the processor includes an adaptive Kalman filter, the two-hour training may model its characteristics to control the oscillation frequency, in the event of non-visibility in GLONASS.

In an example, the calculated CTE or the correction data (or value) is stored and the stored data is updated when the most recently data is provided by the error calculator. The stored data is unchanged during satellite holdover period. Then, the stored error or data is used while no input reference timing signal or accurate predicted frequency value from the processor is available.

According to another aspect of the present invention, there is provided a method for providing a timing output signal. In the method, an oscillator generates an oscillation output signal in response to a control component of an input control signal. A difference corresponding to a time difference between the oscillation output signal and an input reference timing signal is detected when the input reference timing signal is available. A phase error in a detected difference is calculated over a given time period to provide a calculated phase error. The control component of the input control signal applied to the oscillator is changed, in accordance with the calculated phase error and a frequency dependent element relating to the oscillator. The frequency dependent element is provided, in accordance with a characteristic model that is updateable in accordance with the calculated phase error when the input reference timing signal is available. The timing output signal is provided in accordance with the oscillation output signal.

Advantageously, in the method, a frequency of the oscillation output signal generated by the oscillator is controlled, in accordance with the determined control component of the input control signal. By the method, the timing output signal is provided when the input reference timing signal is unavailable.

For example, the characteristic model is adaptively updated in accordance with aging and temperature characteristics relating to the oscillator. Since the first and second parameters of the model relate to frequency dependent elements on the frequency of the oscillator, with adaptively updating of the characteristic model and the parameters, the frequency change to the oscillation signal over time is compensated.

According to yet another aspect of the present invention, there is provided an apparatus for generating a reference signal for use in a cellular base station. The apparatus includes a receiver for generating an input reference timing signal when a cellular signal is available. In the apparatus, an oscillator generates an oscillation output signal in response to a control component of an input control signal. A difference detector detects a difference corresponding to a time difference between the oscillation output signal and the input reference timing signal when the input reference timing signal is available. A difference signal is provided. The apparatus also includes an error calculator for calculating phase error in the difference signal over a given time period to provide a calculated phase error; a processor for providing a frequency control value in accordance with the calculated phase error and a frequency dependent element relating to the oscillator. The frequency dependent element is provided in accordance with a characteristic model that is updateable in accordance with the calculated phase error when the input reference timing signal is available. In the apparatus, an oscillation controller determines the control component of the input control signal applied to the oscillator in accordance with the calculated phase error provided by the error calculator and the frequency control value provided by the processor.

Advantageously, in the apparatus, a frequency of the oscillation output signal generated by the oscillator is controlled in accordance with the determined control component of the input control signal.

The apparatus may be formed by a phase-locked loop (PLL) included as a reference clock signal in a cellular base station in which the reference clock signal is provided by a satellite receiver.

The model updating of the processor may be performed by a computer algorithm With such model updating, oscillators of low stability performance may be used as cellular base station reference oscillator, because high frequency stability is achieved. In order to update the characteristic model, adaptive algorithm may be used. For example, an adaptive filter is used for the adaptive algorithm.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the present invention, and it is to be understood that other embodiments may be utilized and that logical, mechanical, electrical, and other changes may be made without departing from the scope of the present invention. The following detailed description is, therefore, not to be taken in a limiting sense, and the scope of the present invention is defined only by the appended claims.

The present invention is applicable to a computer algorithm which adaptively models the multiple frequency dependent characteristics in relation to an oscillator following a "training period". The subsequent model predicts the future frequency state of the oscillator on which it was trained. The predicted frequency of the model functions as a reference to correct the oscillator frequency in the event that no other stable correction signal is available. The algorithm may be implemented in firmware. The computer algorithm may be provided with an adaptive filter.

In the following discussion, embodiments will be described with reference to applications to "satellite" in general. It is evident that the satellite system includes existing positioning systems, for example, the Global Positioning System (GPS), the Russian Global Navigation Satellite System (GLONASS) positioning system and the European Galileo system and future proposed systems. The satellites provide radio signals that are synchronized and usable by the receivers to derive very accurate time references. The satellite receivers of the systems comprise part of base stations of communication systems.

Figure 1:
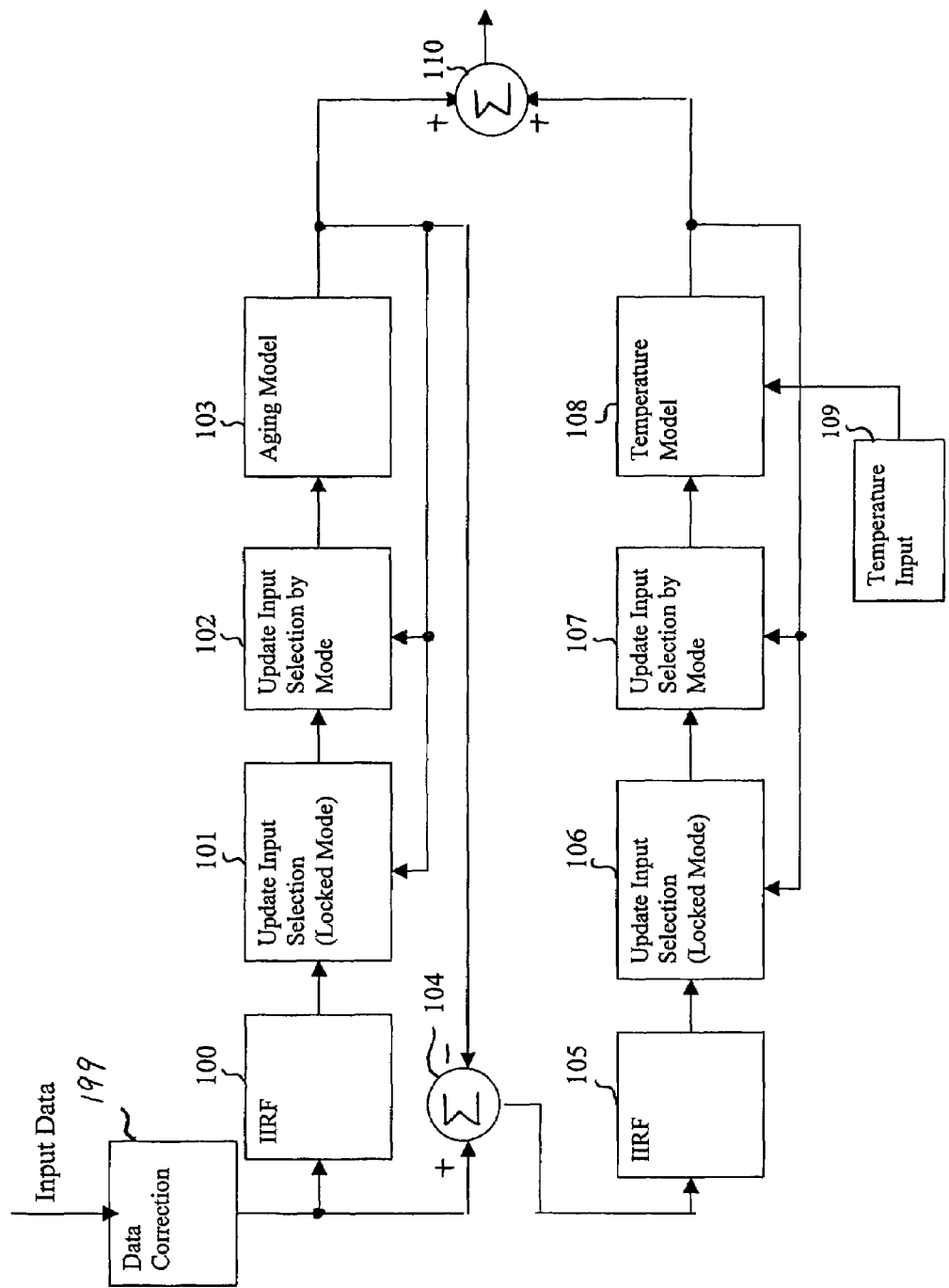
FIG. 1 illustrates the function of blocks of one embodiment according to the present invention.

FIG. 1 illustrates the function implemented in one embodiment according to the present invention which provides a clock signal in a CDMA base station (not shown). There are two operating modes: satellite locked mode and holdover mode. Referring to FIG. 1, raw input data of the frequency of an oscillator (not shown) is fed to a data correction processor 199 for data correction from error.

Corrected output data from the data correction processor 199 is fed to an infinite impulse response filter (IIRF) 100 which in turn provides its IIRF filtered output data to a locked-mode input selector 101. The locked-mode input selector 101 selects its input data and its selected data is fed to a satellite-holdover input selector 102 which provides data selected in accordance with a mode to an aging model calculator 103. In the satellite locked mode, the data selected by the locked-mode input selector 101 is fed to the aging model calculator 103.

The aging model calculator 103 calculates Kalman filter function values in accordance with the input data and updates an aging model thereof, so that the future frequency state of the oscillator is predicted from the updated model. The aging model relates to the aging characteristic of the oscillator. In accordance with the updated model, output data is fed from the output of the aging model calculator 103 to the locked-mode input selector 101 and the satellite-holdover input selector 102. In the event that the aging model needs to be periodically updated by its preceding state, the locked-mode input selector 101 selects the output data of the aging model calculator 103 as input data, so that the output data is fed back to the input of the aging model calculator 103. Accordingly, the aging model is updated by the preceding state.

In the holdover mode, the input data is unavailable and the satellite-holdover input selector 102 selects the output data of the aging model calculator 103 and feeds it back to the input thereof, so that the aging model of the aging model calculator 103 is updated in accordance with its preceding state in the holdover period.

The corrected data from the data correction processor 199 is subtracted by the output data of the aging model calculator 103 in a subtractor 104 and the subtracted data is fed to an IIRF 105. The IIRF filtered output data is fed to a locked-mode input selector 106. The locked-mode input selector 106 selects its input data and its selected data is fed to a satellite-holdover input selector 107 which provides selected data, in accordance with a mode, to a temperature model calculator 108. In the satellite locked mode, the data selected by the locked-mode input selector 106 is fed to the temperature model calculator 108. Also, a temperature sensor 109 provides the temperature model calculator 108 with temperature input data that relates to the oscillator.

The temperature model calculator 108 calculates Kalman filter function values in accordance with the input data and updates a temperature model thereof, so that the future frequency state of the oscillator is predicted from the updated model. The temperature model relates to the temperature characteristic of the oscillator.

In accordance with the updated model, output data is fed from the output of the temperature model calculator 108 to the locked-mode input selector 106 and the satellite-holdover input selector 107. In the event that the temperature model needs to be periodically updated by its preceding state, the locked-mode input selector 106 selects the output data of the temperature model calculator 108 as input data, so that the output data is fed back to the input of the temperature model calculator 108. Accordingly, the temperature model is updated by the preceding state.

In the holdover mode, the input data is unavailable and the satellite-holdover input selector 107 selects the output data of the temperature model calculator 108 and feeds it back to the input thereof, so that the temperature model of the temperature model calculator 108 is updated in accordance with the preceding state in the holdover period.

The aging model calculator 103 and the temperature model calculator 108 update their models adaptively. Such update function is achieved by adaptive algorithm. The Kalman filters are used to perform the adaptive algorithm function, as exampled, in the embodiment.

The output data of the aging model calculator 103 and the temperature model calculator 108 is fed to an adder 110 which provides added data of both the aging model calculator 103 and the temperature model calculator 108. The added data represents a predicted frequency dependent element in accordance with the aging and temperature characteristics of the updated models. The predicted frequency element is provided to the oscillator, so that the oscillator changes its oscillation frequency in accordance with the predicted frequency element, regardless of the satellite locked mode or the holdover mode. Therefore, the oscillation frequency is controlled in accordance with the models' elements updated by input data in the satellite-mode (a training period) and with the models' elements in the holdover mode, the elements having been updated in the training period.

Figure 2:
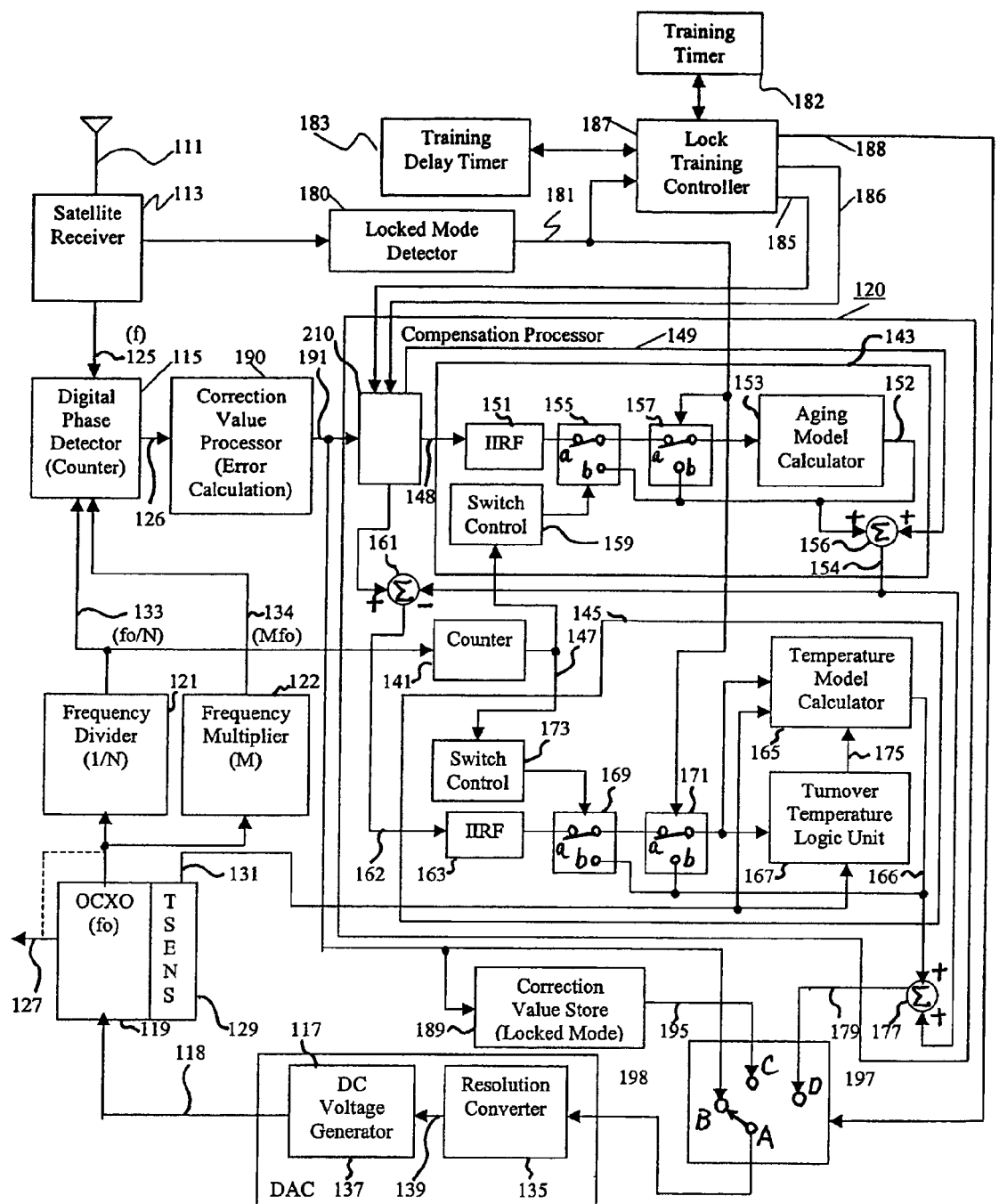
FIG. 2 is a block diagram of a reference timing signal apparatus used in a CDMA base station according to one embodiment of the present invention.

FIG. 2 shows a reference timing signal apparatus according to one embodiment of the present invention. The embodiment includes an oscillator with phase-locked loop (PLL) which provides a clock signal in a CDMA base station, for example. The function of each block or unit shown in FIG. 2 corresponds to that of each of blocks shown in FIG. 1.

Referring to FIG. 2, an antenna 111 is connected to a satellite receiver 113. The satellite receiver 113 is connected to a PLL including a digital phase detector 115, a digital-to-analog converter (DAC) 117, an oven-controlled crystal oscillator (OCXO) 119 and a frequency divider 121. The reference timing signal apparatus includes a locked mode detector 180 which is connected to the satellite receiver 113. The locked mode detector 180 detects a satellite locked mode and a holdover mode thereof and produces a mode switching signal 181 in accordance with the detected mode.

Furthermore, the reference timing signal apparatus includes a correction value processor 190 for calculating a correction value (correction data) for loop control from phase error and a compensation processor 120 for compensating frequency drift over time in response to a loop correction signal 191 from the correction value processor 190. The mode switching signal 181 is also fed to a lock training controller 187 which is connected to a training timer 182 and a training delay timer 183. The lock training controller 187 provides an initial control signal 185, a training initiation signal 186 and a DAC value selection signal 188 in response to time information provided by the training timer 182 and the training delay timer 183 and the mode switching signal 181. A training time is based on a timing signal provided by the training timer 182.

In normal operation (a satellite locked mode), an input reference timing signal (pulse signal) 125 (satellite-generated timing signal) is available from the satellite receiver 113. The OCXO 119 is locked with the input reference timing signal 125 and a base station reference timing signal 127 is provided by the reference timing signal apparatus (and the OCXO 119). In the normal operation, in response to the input reference timing signal 125 received from the satellite receiver 113, the PLL closely tracks the satellite-generated timing signal. During the holdover period (i.e., in the event that the input reference timing signal 125 is unavailable), the base station reference timing signal 127 is provided by the OCXO 119 that had been phase-locked and is self-oscillated. The OCXO 119 has a temperature sensor (TSENS) 129 which provides a temperature signal 131 representing sensed temperature in relation to the OCXO 119. The compensation processor 120 compensates frequency drift of the OCXO 119 over time and in response to the temperature signal 131.

The digital phase detector 115 detects the difference in phase between the input reference timing signal 125 (the satellite-generated timing signal) and the base station reference timing signal 127 provided by the OCXO 119. A phase detect output signal 126 from the digital phase detector 115 is fed to the correction value processor 190 which provides the loop correction signal 191. The loop correction signal 191 is fed to a correction value storage 189 which stores the most recent correction value calculated by the correction value processor 190 in the satellite locked mode. Also, the loop correction signal 191 is fed to the compensation processor 120 to be filtered and processed thereby. The compensation processor 120 operates as a filter when the compensation processor 120 is fully trained.

A compensation processed signal 179 representing voltage compensated by an adder 177 of the compensation processor 120 is fed to a DAC value selection switch 197 (terminal D"). The loop correction signal 191 from the correction value processor 190 and a stored correction value signal 195 from the correction value storage 189 are also fed to the DAC value selection switch 197 (terminals "B" and "C", respectively). A selected value signal 198 selected by the DAC value selection switch 197 (from terminal "A") is fed to the DAC 117 which provides the OCXO 119 with an analog steering voltage of an electronic frequency control (EFC) input signal 118. The EFC input signal 118 has an analog steering voltage as a control component applied to the OCXO 119 to vary (or control) the oscillation frequency thereof.

The OCXO 119 produces the base station reference timing signal 127 having a frequency fo which is fed to the frequency divider 121 having a division factor N (e.g., 1). A frequency divided output signal (pulse signal) 133 having a frequency of fo/N is fed to the digital phase detector 115. The output of OCOX 119 is also fed into a frequency multiplier 122 having a multiplication factor M (e.g., 16). The frequency multiplier 122 provides a frequency multiplied output signal (pulse signal) 134 having frequency fo×M. The frequency multiplied signal 134 is fed into the digital phase detector 115 having a counter (not shown). The counter is started by the rising edge of the frequency divided output signal 133 and stopped by the rising edge of the reference signal 125. The counter increments at a rate determined by the frequency multiplied output signal 134.

The output of the digital phase detector 115 is the phase error between the reference signal 125 and the frequency divided output signal 133 in terms of the number of cycles of the frequency multiplied output signal 134. The phase detect output signal 126 from the digital phase detector 115 is fed to the compensation processor 120 through the correction value processor 190 to adjust the output voltage applied to the OCXO 119 through the DAC 117, so that the phase difference between the input reference timing signal 125 and the frequency divided output signal 133 is minimized. This PLL-based feedback circuitry therefore steers the frequency of the OCXO 119 to provide the base station reference timing signal 127 having a frequency of fo (=Nf), f being the frequency of the input reference timing signal 125. The base station reference timing signal 127 may be obtained from the frequency divider 121, the frequency of which is fo/N.

The compensation processor 120 includes a compensation input controller 210, a counter 141, an aging characteristic processing unit 143 and a temperature characteristic processing unit 145. The counter 141 counts pulses of the frequency divided output signal 133 to provide a frequency count signal 147 to the aging characteristic processing unit 143 and the temperature characteristic processing unit 145. When the satellite-generated timing signal is available (i.e., the input reference timing signal 125 is provided by the satellite receiver 113), the phase detect output signal 126 is fed to the correction value processor 190 which provides the loop correction signal 191 to the compensation input controller 210. The compensation input controller 210 provides a filter input signal 148 and an initial value signal 149, in response to the initial control signal 185 and the training initiation signal 186.

Figure 3:
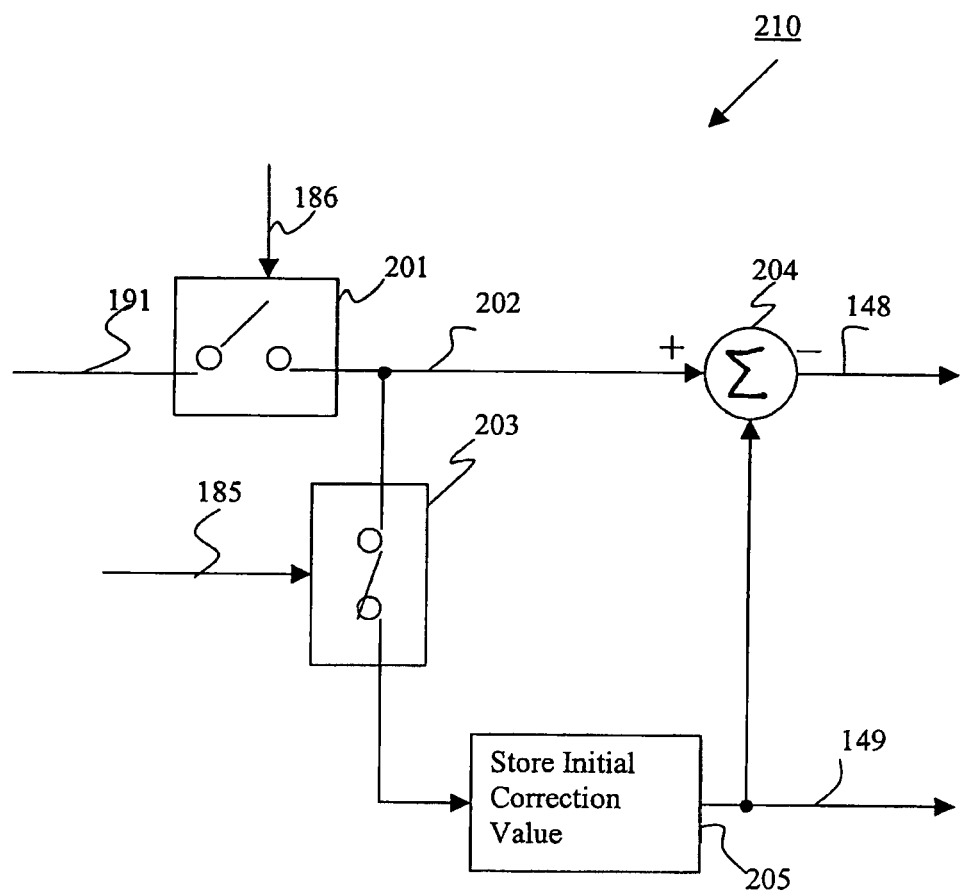
FIG. 3 is a block diagram of a compensation input controller shown in FIG. 2.

A detailed configuration of the compensation input controller 210 is shown in FIG. 3. Referring to FIGS. 2 and 3, a delay switch 201 is controlled by the training initiation signal 186 and, when closed, passes the loop correction signal 191 as a correction input signal 202 which is fed to an initial switch 203 and a subtractor 204. The initial switch 203 is controlled by the initial control signal 185 to pass the correction input signal 202 to a correction initial value storage 205 that provides the initial value signal 149. The correction value represented by the correction input signal 202 is subtracted by the initial correction value stored in the correction initial value storage 205 is provided by the subtractor 204 that provides the filter input signal 148.

The filter input signal 148 is fed to the IIRF 151. The filtered output signal from the IIRF 151 is fed to an aging model calculator 153 through an aging model update switch 155 and a satellite-holdover mode switch 157 when both switches are connected to their terminals "a". Each of the aging model update switch 155 and the satellite-holdover mode switch 157 has two terminals "a" and "b".

The connection of the satellite-holdover mode switch 157 is controlled by the mode switching signal 181 provided by the locked mode detector 180 in accordance with the availability of the satellite-generated timing signal. The satellite-holdover mode switch 157 is connected to its terminals "a" and "b", when the satellite-generated timing signal is available (i.e., the satellite locked mode) and unavailable (i.e., the holdover period), respectively.

The frequency count signal 147 from the counter 141 is fed to a switching controller 159 of the aging characteristic processing unit 143 which controls the connections of the aging model update switch 155 to its terminals "a" and "b". The switching controller 159 determines whether the clock value Clk represented by the frequency count signal 147 is equal to m×Int, wherein m is an update rate for aging model and Int is a predetermined maximum value (an integer). An example of the update rate m is one every 45 min. In a case of Clk being m×Int, the switching controller 159 controls the aging model update switch 155 to be connected to its terminal "a". In a case of Clk not being m×Int, the switching controller 159 controls the aging model update switch 155 to be connected to its terminal "b".

The aging characteristic processing unit 143 also includes an adder 156 which receives the initial value signal 149 from the correction initial value storage 205 and an aging model calculation signal 152 from the aging model calculator 153. An added output from the adder 156 is provided as an aging model output signal 154. The aging model calculation signal 152 is commonly provided to the terminals "b" of the both of the aging model update switch 155 and the satellite-holdover mode switch 157.

The filter input signal 148 from the adder 204 of the compensation input controller 210 and the aging model output signal 154 of the aging characteristic processing unit 143 are fed to a subtractor 161, the output of which is a subtracted signal 162. The subtracted signal 162 is fed to an IIRF 163 of the temperature characteristic processing unit 145. The filtered output signal from the IIRF 163 is fed to a temperature model calculator 165 and a turnover temperature logic unit 167 through a temperature model update switch 169 and a satellite-holdover mode switch 171, when both switches are connected to their terminals "a". Each of the temperature model update switch 169 and the satellite-holdover mode switch 171 has two terminals "a" and "b". The terminals "b" of both switches are commonly connected to an output terminal of the temperature model calculator 165. The connection of the satellite-holdover mode switch 171 is controlled by the mode switching signal 181 provided by the locked mode detector 180 in accordance with the availability of the satellite-generated timing signal. The satellite-holdover mode switch 171 is connected to its terminals "a" and "b", when the satellite-generated timing signal is available and unavailable, respectively.

The frequency count signal 147 is also fed to a switching controller 173 of the temperature characteristic processing unit 145 which controls the temperature model update switch 169 to be connected to its terminals "a" and "b". The switching controller 173 determines whether the clock value Clk represented by the frequency count signal 147 is equal to p×Int, wherein p is an update rate for temperature model and Int is a predetermined maximum value. An example of the update rate p is one every 1.5 min. In a case of Clk being p×Int, the switching controller 173 controls the temperature model update switch 169 to be connected to its terminal "a". In a case of Clk not being p×Int, the switching controller 173 controls the temperature model update switch 169 to be connected to its terminal "b".

The temperature signal 131 from the temperature sensor 129 of the OCXO 119 is fed to the temperature model calculator 165 and the turnover temperature logic unit 167. The turnover temperature logic unit 167 performs temperature calculation in accordance with the oscillator temperature and the IIRF filtered output to provide a turnover temperature signal 175 to the temperature model calculator 165. In response to the turnover temperature signal 175, the temperature model calculator 165 performs temperature model calculation in accordance with the IIRF filtered output and the oscillator temperature and provides a temperature model output signal 166 representing the updated temperature model output value.

The aging model output signal 154 from the aging characteristic processing unit 143 and the temperature model output signal 166 from the temperature characteristic processing unit 145 are fed to the adder 177. The adder 177 provides the compensation processed signal 179 to the DAC value selection switch 197 (terminal "D"). The connection or selection of the DAC value selection switch 197 is controlled by the DAC value selection signal 188 provided by the lock training controller 187. The selected value signal 198 is provided to the DAC 117 that includes a resolution converter 135 and a DC voltage generator 137.

In response to the selected value signal 198, the resolution converter 135 provides a resolution converted signal 139 to the DC voltage generator 137 which provides the EFC input signal 118 to the OCXO 119. The voltage of the EFC input signal 118 is controlled by the selected value signal 198. The OCXO 119 performs oscillation in accordance with the EFC input signal 118, regardless whether the satellite-generated timing signal is available (in the satellite locked mode) or the satellite-generated timing signal is unavailable when the base station loses contact with satellite (the satellite is not visible), i.e., the holdover period (the holdover mode).

Each of the aging model calculator 153 and the temperature model calculator 165 includes a Kalman filter. The Kalman filter includes a model of the characteristics and provides an error estimate amount as an output. The Kalman filter is known to those skilled in the art. It may comprise a model which performs state estimation, forecasting for oscillator characteristics of frequency aging and temperature. The Kalman filter provides internal estimates of the variances of each of the state estimates. The Kalman filter includes various algorithms necessary to perform prediction error analysis and to estimate the time, frequency, and frequency aging over an initial interval and then forecasts them into the future. The operation of Kalman filter is described in, for example, U.S. Pat. No. 5,144,595, which is incorporated herein by reference.

Figure 4:
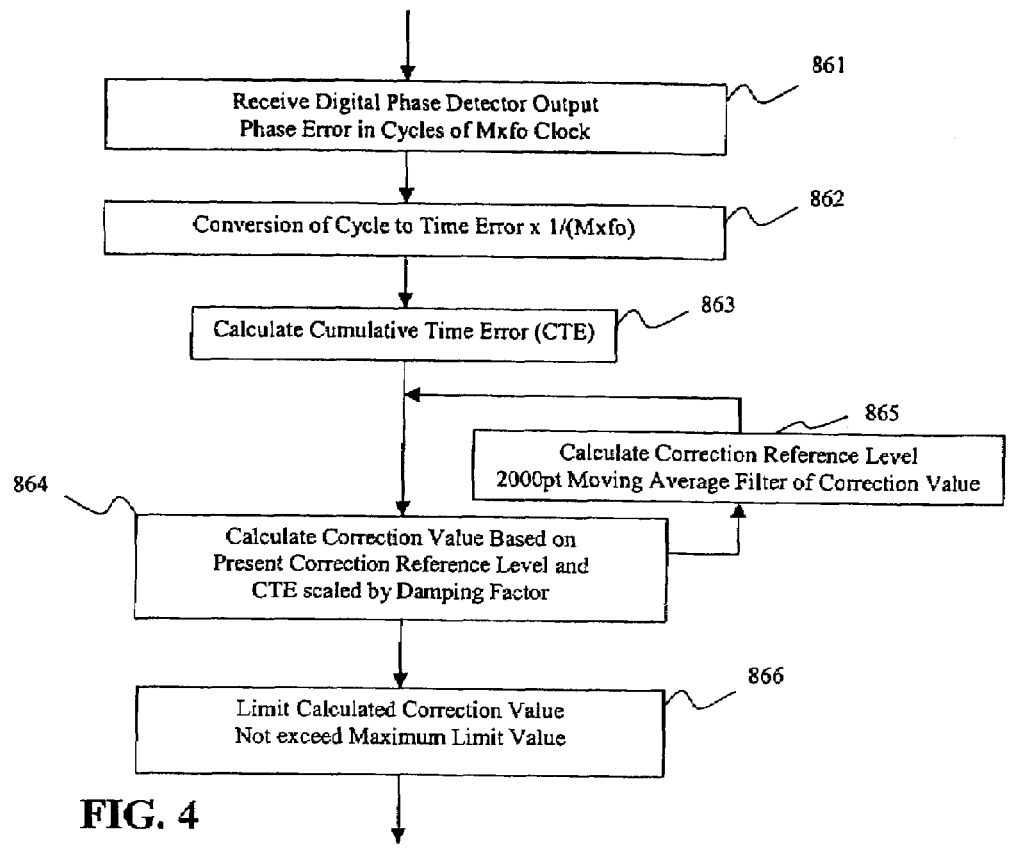
FIG. 4 is a flowchart showing the operation of a correction value processor in the reference timing signal apparatus shown in FIG. 2.

FIG. 4 shows the operation of the correction value processor 190 shown in FIG. 2. Referring to FIGS. 2, 3 and 4, the correction value processor 190 receives the phase detect output signal 126 from the digital phase detector 115 (step 861). The phase detect output signal 126 contains the phase error in terms of number of cycles of the frequency multiplied output signal 134 between the input reference timing signal 125 and the frequency divided output signal 133. The phase error data is to be updated every second. The correction value processor 190 first converts the digital phase detector output from a number of fo×M cycles to a time error in nanoseconds (step 862). The cycle to time conversion is achieved through multiplication of the number of cycles output from the digital phase detector 115 by the period of the frequency multiplied output signal 134. For example, the oscillation frequency is 10 MHz and the frequency multiplication factor M is 16, hence the frequency multiplied output signal 134 has a period of 6.25 ns.

Under the previously mentioned circumstances, if the digital phase detector 115 outputs a count value of 10 cycles then the corresponding time error between the reference signal 125 and the frequency divided output signal 133 is 10×6.25 ns or 62.5 ns. The correction value processor 190 next calculates cumulative time error ($CTE_J$) at a time J (step 863). The $CTE_J$ is calculated by:

$$CTE_J = CTE_{J-1} + \text{time error per second} \quad (1)$$

where:
$CTE_{J-1}$ is the cumulative time error at a time of J−1 (i.e., one second (one time step) earlier than the time J); and
The time error per second is the phase error in nanosecond.

The CTE is the second by second summation of the time error between the one pulse per second of the input reference timing signal 125 and the one pulse per second of the frequency divided output signal 133, the cycle of which is a division of the 10 MHz signal of the OCXO 119.

Next, the correction value processor 190 calculates a correction value Cor based on a moving average of the past and present correction values and a value of the GTE scaled by a damping constant (step 864). The correction value Cor is calculated by:

$$Cor = Corpr - CTE/\alpha \quad (2)$$

where:
Corpr is a moving average of the past and present correction values; and

α is a damping factor for the control loop bandwidth.

The damping factor α is variable. The damping factor is set to unity during the initial pull and recovery mode to minimize the lock time of the PLL. Under the PLL-locked operation, the damping factor is set at 150 to provide noise rejection against the second to second random phase variations caused by the satellite receiver noise.

Simultaneously, the correction value processor 190 calculates a level of the correction reference Corpr from a 2000 point moving average of the correction signal (step 865) prior to passing through the correction limit (step 866). The calculated level of the correction reference (i.e., Corpr) at step 865 is used to calculate the cumulative correction signal (step 864).

After the operation of step 864 is performed, the correction value processor 190 limits the correction value Cor calculated to 45 ppb, for example, as required by the specification of the base station system, a single correction cannot exceed 45 ppb (step 866). The correction signal output resulted from step 866 is used to control the DAC 117.

Figure 5:
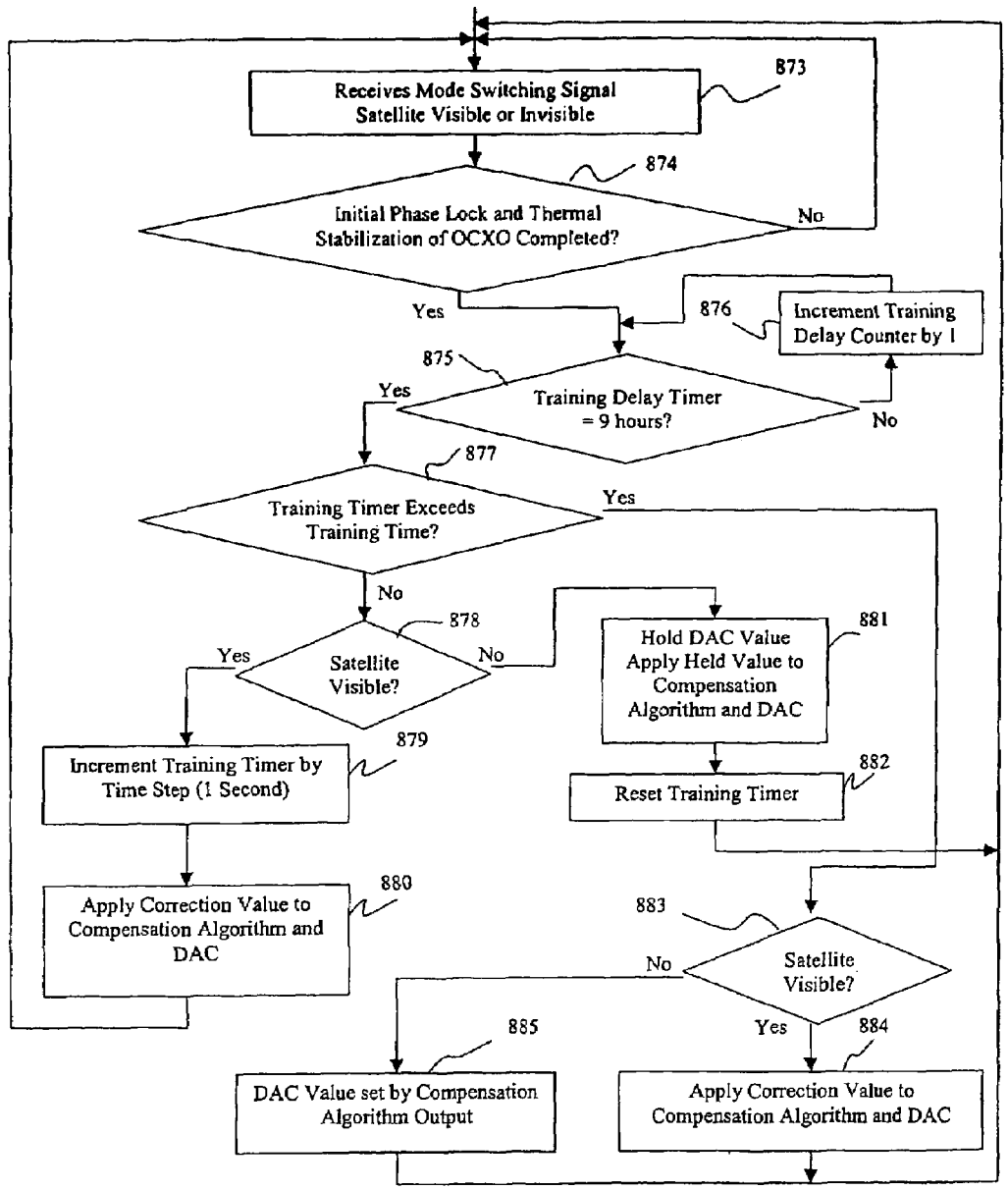
FIG. 5 is a flowchart showing the control operation by a lock training controller in the reference timing signal apparatus shown in FIG. 2.

FIG. 5 shows the control operation by the lock training controller 187 shown in FIG. 2. Referring to FIGS. 2, 3 and 5, when the system (the CDMA base station) implementing the reference timing signal apparatus is turned on (power up) to use, the lock training controller 187 operates. The lock training controller 187 receives the mode switching signal 181 in response to the satellite receiver 113 (step 873). Thus, the lock training controller 187 knows the lock status of the satellite receiver 113 based on the availability of the clock signals of the input reference timing signal 125. In the normal operation, the mode switching signal 181 (SLOCK) is "1" which means that the satellite receiver 113 is satellite-locked (or the satellite is visible) and during the holdover period the mode switching signal 181 is "0" which means that the satellite receiver 113 is unlocked (or the satellite is not visible). In response to the mode switching signal 181, the lock training controller 187 determines whether the satellite is visible or non-visible.

The lock training controller 187 determines whether the initial phase-lock and thermal stabilization of the OCXO 119 is completed (step 874). It waits for the completion of the initial phase-lock and thermal stabilization. The lock training controller 187 is associated with two timers: the training timer 182 and the training delay timer 183. The training timer 182 runs for a predetermined warming-up time $T_{TH}$ (e.g., 30 minutes) following power up of the system. The training timer 182 indicates to the system when the specified OCXO 119 has thermally stabilized. Once the training timer 182 reaches the initial warming-up time $T_{TH}$, the system is flagged that the OCXO 119 has thermally stabilized sufficiently to initiate calibration of the oscillator tuning sensitivity termed Kvco. The tuning sensitivity Kvco calibration is conducted in a given short time period (e.g., 200 seconds) following the warming-up time. The tuning sensitivity Kvco calibration procedure first records the phase error output from the digital phase detector 115 and converts it to ppb.

The output of the digital phase detector 115 is in terms of number 160 MHz cycles, which are converted to ppb by multiplication by the period of the frequency multiplied output signal 134 of 160 MHz. A 50 ppb step, for example, is applied to the correction signal fed to the DAC 117 up to this point in time the correction signal has been held at zero. The DAC 117 converts the correction signal to a control voltage causing the OCXO 119 frequency to change. The loop correction signal 191 contains the change in the OCXO 119 frequency and outputs of a new number of cycles to represent the detected phase change. The phase difference before and after application of the 50 ppb step is divided by the voltage applied by the DAC to determine the Kvco of the OCXO 119.

Following the tuning sensitivity Kvco calibration the control loop closes and takes only a few hundred seconds to align the phase of the OCXO 119 with the phase of the external reference to within a set range (~200 ns), the digital phase detector 115 detects when the phase threshold has been passed and then declares the system phase-locked.

Once phase-locked (the positive outcome of step 874), the training delay timer 183 is activated. The training delay timer 183 delays application of the control loop signal to the compensation processor 120 for nine hours, for example, following the lock declaration. The nine-hour delay is independent of satellite visibility and is to ensure fine stabilization of the OCXO 119 and control loop characteristics, prior to data application to the compensation algorithm (i.e., the compensation processor 120).

In a case of the training delay timer not reaching the nine-hour delay time (negative in step 875), the training delay timer 183 is incremented by a time step (e.g., one second) (step 876). This cycle continues until the training delay timer 183 reaches the delay time (positive in step 875). Whilst training delay is in progress, the system can enter holdover. In such an event, the control signal 188 from the lock training controller 187 sets the DAC selection switch 197 to connect terminals "A" to "C", so that the DAC value is locked at the stored correction value held by the correction value storage 189. Under conditions of satellite visibility, the DAC selection switch 197 connects terminals "A" to "B", under control by the lock training controller 187. During the training delay time, even if satellite visibility is lost the training delay timer 183 continues to increment (step 876) and the DAC selection switch 197 is connected to terminal "C" under control by the lock training controller 187. Hence, the stored correction value from the correction value storage 189 is used to control the oscillation frequency.

Upon completion of the nine-hour fine stabilization period of the delay time, the training timer 182 is activated for a training purpose. The training timer 182 is controlled by the lock training controller 187 that outputs signal 188 to control the DAC selection switch 197. The objective of the training timer 182 and the lock training controller 187 is to ensure that the compensation processor 120 is trained continuously for a give time period or training time (e.g., two hours) following the training delay of nine hours. If the training timer 182 reaches the training time of two hours then the compensation processor 120 is considered fully trained as indicated by the positive outcome of step 877.

When the training timer 182 is activated, the lock training controller 187 provides the training initiation signal 186 to close the delay switch 201 of the compensation input controller 210, thereby allowing data to enter the compensation processor 120 (the aging characteristic processing unit 143). In a short time period (e.g., one second) after the training initiation signal 186, the lock training controller 187 provides the initial control signal 185 to open the initial switch 203. Thus, the initial data from correction value processor 190 is stored in the correction initial value storage 205. A stored initial data represented by the initial value signal 149 is continuously provided from the correction initial value storage 205, after the initial switch 203 being opened. Thereafter, the correction value represented by the correction input signal 202 is subtracted by the stored initial value in the subtractor 204. Offset data by the initial value is always fed by the adder 204 to the IIRF 151 of the aging characteristic processing unit 143. Also, the stored initial value is provided to the adder 156 to add it to the output data from the aging model calculator 153, so that the offset initial value is compensated at the output side of the aging model calculator 153. Hence, because at the initial data input phase a great difference value is not fed to the IIRF 151, it does not require a wide bandwidth to track the phase difference.

In a case of the training timer not reaching the training time of two hours (negative in step 877), it is determined whether satellite is visible (step 878). In the event of being visible, the training timer 182 is incremented by a time step (e.g., one second) (step 879). The correction value from the correction value processor 190 is applied to the compensation processor 120 through the compensation input controller 210 to the aging model calculator 153 of the compensation processor 120 and to the DAC 117 through the DAC value selection switch 197 (terminals "B"–"A") (step 880). Upon receipt of the correction value represented by the loop correction signal 191, the aging model calculator 153 of the compensation processor 120 is trained. At the same time, the correction value is stored in the correction value storage 189 and thus, the correction value stored therein is updated every time when the most recent correction value is fed thereto by the correction value processor 190. The cycle continues until completion of the training period.

During the training period of two hours, in the event that satellite visibility is lost (i.e., SLOCK=0) (negative in step 878), the value stored in the correction value storage 189 remains no change. In response to the DAC value selection signal 188 provided by the lock training controller 187, the DAC value selection switch 197 is connected to terminal "C". The correction value stored in the correction value storage 189 is fed to the DAC 117 for duration of the holdover (step 881). The training timer 182 is reset to zero (step 882). If during the training time of two hours, satellite becomes repeatedly invisible, the training timer will never exceed the training time of two hours. If a full uninterrupted two hours of training does not occur, the system will be reliant on the correction value storage 189, which is sufficiently accurate to maintain time accuracy for the system in the event of such short duration holdover events. Then, it returns to step 873 and the cycle continues.

On recovery of satellite visibility, training re-starts based on the positive outcome of step 878. The training timer 182 is incremented (step 879). The IIRF output data from the IIRF 151 is fed to the aging model calculator 153 through the aging model update switch 155 and the satellite-holdover mode switch 157. Also, the most recent correction value, represented by the loop correction signal 191, calculated by the correction value processor 190 is fed to the correction value storage 189 to be stored therein. In response to the DAC value selection signal 188 provided by the lock training controller 187, the DAC value selection switch 197 is connected to terminal "B", the most recent correction value is fed to the DAC 117 (step 880). Satellite lock is then re-checked at step 878 and the cycle continues.

It is required that a full uninterrupted two hours of training occur for the compensation processor 120 to be declared fully trained. The training timer 182 ensures even in conditions of sporadic satellite visibility that the compensation processor 120 is trained continuously for two hours, such a capability is essential when low numbers of satellites are present in the constellation (<=7) as is the case with the Russian GLONASS.

In a case where the training timer 182 reaches the training time (positive determination at step 877), the lock training controller 187 sends the DAC value selection signal 188 to control the DAC selector switch 197. Again, it is determined whether the lock status is the satellite locked mode or the holdover mode (step 883). If the satellite status is the locked mode (SLOCK=1), the DAC selector switch 197 is connected to the terminal "B". The IIRF output response to the data from the correction value processor 190 is fed to the aging model calculator 153, so that the compensation characteristics of the compensation processor 120 are updated. Also, the data of the loop correction signal 191 is fed to the DAC 117 through the DAC value selection switch 197 (terminals "B"–"A") (step 884). It returns to step 873 and the cycle continues.

In a case where the satellite status is the holdover mode (negative determination at step 883), the DAC value selection signal 188 from the lock training controller 187 controls the connection of the DAC value selection switch 197 to connect terminal "D" and the compensation processed signal 179 of the compensation processor 120 is fed to the DAC 117 (step 885). Thus, the value of the DAC 117 is set by the data of the compensation processed signal 179. In the holdover mode, the satellite-holdover mode switches 157 and 171 are connected to their terminals "b" and thus, the aging characteristic processing unit 143 and the temperature characteristic processing unit 145 do not update their compensation models with correction value data represented by the loop correction signal 191. It returns to step 873 and the cycle continues.

Figure 6:
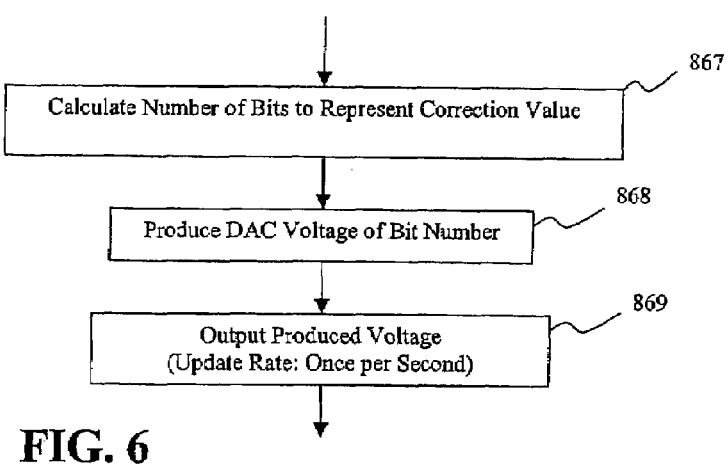
FIG. 6 is a flowchart showing the operation of a digital-to-analog converter (DAC) in the reference timing signal apparatus shown in FIG. 2.

FIG. 6 shows the operation of the DAC 117 shown in FIG. 2. Referring to FIGS. 2 and 6, the DAC 117 operates in response to the data represented by the selected value signal 198. The data is provided at steps 880, 881, 884 and 885 shown in FIG. 5. In the DAC 117, the data represented by the selected value signal 198 is fed to the resolution converter 135 thereof and the resolution converter 135 converts the data bits and the resolution converted signal 139 is fed to the DC voltage generator 137. The DC voltage generator 137 produces voltage in response to the converted bits of the resolution converted signal 139. The voltage produced by the DC voltage generator 137 is represented by the EFC input signal 118 that is fed to the OCXO 119 to control oscillation frequency.

In the DAC 117, a DAC control word is calculated based on the DAC resolution to represent the calculated correction value. The DAC resolution is the frequency change in the OCXO 119 in ppb per bit. The resolution converter 135 of the DAC 117 performs the calculation of the DAC control word (bits) by rounding $$Cor/((Kvco \times Rgcon)/(2^{NDAC})) \qquad (3)$$

where:
Kvco is a tuning sensitivity of the OCXO 119 (ppb/volt) which is calculated during a calibration procedure at the initiation of the algorithm (prior to calibration the Kvco value is set at a default value of 150 ppb/volt);
Rgcon is an OCXO control voltage range;
NDAC is a DAC number (bit); and
Cor is the calculated correction value.

In the current implementation, for example, a five-volt range for the OCXO control voltage range is used with a 20 bit DAC and consequently, the voltage change per bit is $5/2^{20}$. To calculate the frequency change per bit, the tuning sensitivity of the OCXO termed Kvco in ppb/volt is multiplied by the voltage change per bit, so as to give a stability change per bit for the DAC 117 which is termed the DAC resolution. The DAC resolution calculation (at step 867) is, thus, $Kvco \times 5/2^{20}$ ppb/bit. The dividing of the correction value in ppb by the DAC resolution yields the number of bits (step 868). By the number of bits, the DAC 117 must correct the OCXO 119 to change its oscillation frequency. The DAC control word represented by the yielded number of bits is represented by the resolution converted signal 139 provided by the resolution converter 135. In response to resolution converted signal 139, the DC voltage generator 137 converts the yielded number of bits into the voltage (step 869). The converted voltage is represented by the EFC input signal 118 for steering the OCXO 119 to vary the oscillation frequency thereof.

Figure 7:
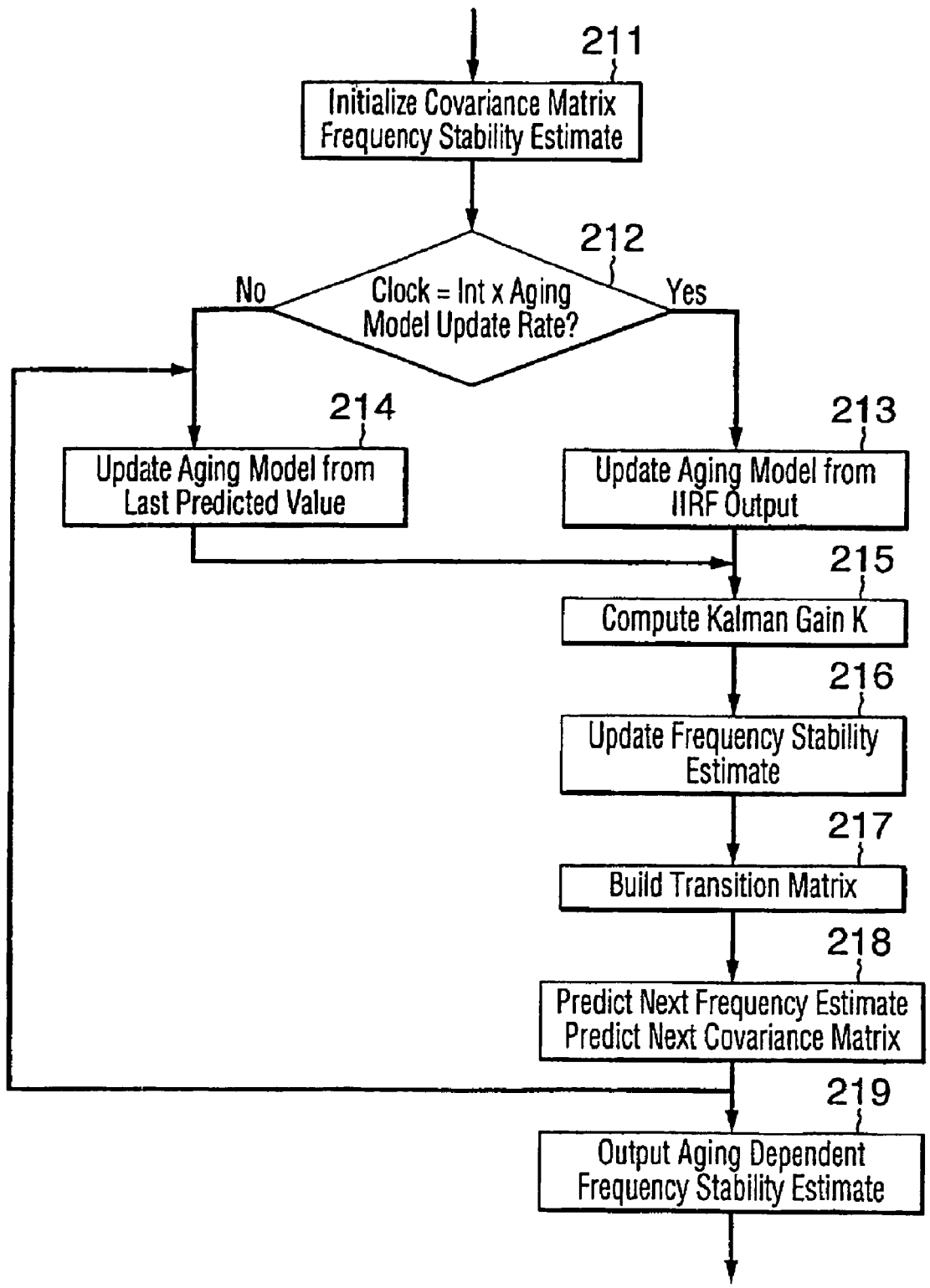
FIG. 7 is a flowchart showing the operation of an aging model calculator in the reference timing signal apparatus shown in FIG. 2.

When the satellite-generated timing signal is available, the PLL including the compensation processor 120 operates in the satellite locked mode and the aging model calculator 153 of the aging characteristic processing unit 143 performs aging dependency frequency stability calculation. FIG. 7 shows its operation. This is performed at step 885 shown in FIG. 5, for example.

Referring to FIGS. 2 and 7, the satellite-holdover mode switch 157 of the aging characteristic processing unit 143 is connected to its terminal "a" for the satellite locked mode, in response to the mode switching signal 181. The aging model calculator 153 initializes its covariance matrix and frequency stability estimates (step 211). The covariance matrix captures the variance of the variants and the covariance of the variants. Variants in the embodiment are the frequency dependence on aging and frequency dependence on temperature. The variance of the variants is captured in the diagonal elements of the covariance matrix. The remaining elements of the matrix capture the covariant terms in the case where the variants are independent such as the present case and the covariant terms are zero.

The switching controller 159 determines whether the clock value Clk represented by the frequency count signal 147 is equal to m (the update rate for aging model)× the predetermined maximum value Int (step 212).

If Clk is equal to m×Int (positive determination at step 212), the switching controller 159 controls the aging model update switch 155 to be connected to its terminal "a". The IIRF filtered output value from the IIRF 151 responding to the filter input signal 148 is fed to the aging model calculator 153 which in turn updates the aging model in accordance with the fed IIRF filtered value (step 213). Thus, it is updated by the raw input data measured based on the satellite-generated timing signal.

If Clk is not equal to m×Int (negative determination at step 212), the switching controller 159 controls the aging model update switch 155 to be connected to its terminal "b". The aging model output signal 154 from the aging characteristic processing unit 143 is fed back to the aging model calculator 153 through the aging model update switch 155 and the satellite-holdover mode switch 157 and thus, the aging model is updated by the last (or the preceding) predicted value of that aging model (step 214).

After the update of the aging model at step 213 or 214, the Kalman gain "K" is computed (step 215) and the frequency stability estimate is updated (step 216). The Kalman gain is calculated as blending factor which determines the degree of emphasis to be placed on the next noisy measurement and the prior estimate of the measurement. The Kalman gain is this linear blending factor.

After the computation of the Kalman gain, a transition matrix is built (step 217). The following is an example of the transition matrix formulation for aging and temperature models.

$$A = \begin{bmatrix} 1 & V_t \cdot \Delta t & a_t \cdot \frac{\Delta t^2}{2} & 0 & 0 & 0 \\ 0 & 1 & V_t \cdot \Delta t & 0 & 0 & 0 \\ 0 & 0 & 1 & 0 & 0 & 0 \\ 0 & 0 & 0 & 1 & V_T \cdot \Delta T & a_T \cdot \frac{\Delta T^2}{2} \\ 0 & 0 & 0 & 0 & 1 & V_T \cdot \Delta T \\ 0 & 0 & 0 & 0 & 0 & 1 \end{bmatrix}$$

where:
$\Delta t$ is a time step;
$\Delta T$ is a temperature step;
$V_t$ is a weighting term on the first derivative aging dependent model;
$a_t$ is a weighting term on the second derivative aging dependent model;
$V_T$ is a weighting term on the first derivative temperature dependent model; and
$a_T$ is a weighting term on the second derivative temperature dependent model.

It is noted that the transition matrix may be expanded to include higher order non linearity terms $\Delta t^3$, $\Delta t^4$, . . . . However, in this embodiment, the aging and temperature dependent characteristics of the OCXO are well modeled by linear dependencies with appropriate weighting functions.

The transition matrix contains the state update equations which when applied to the current state generate the next predicted state. The next frequency estimate and the next covariance matrix are predicted (step 218). After step 218 is performed, steps 214–218 are repeated. In accordance with the predicted frequency estimate and covariance matrix, the aging dependent frequency estimate is provided by the aging model calculator 153 of the aging characteristic processing unit 143 (step 219).

Figure 8:
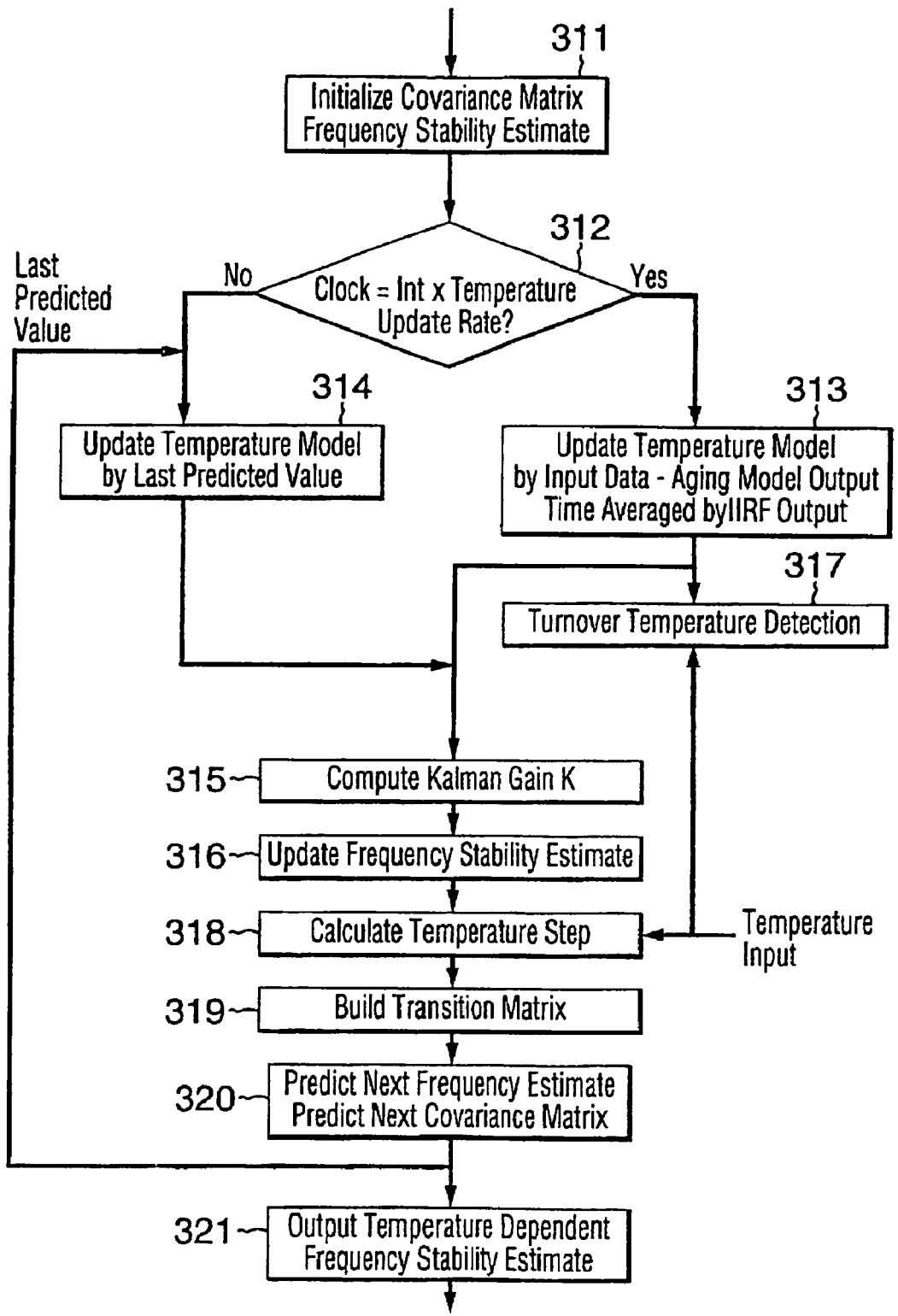
FIG. 8 is a flowchart showing the operation of the temperature model calculator in the reference timing signal apparatus shown in FIG. 2.

In the satellite locked mode, the temperature model calculator 165 of the temperature characteristic processing unit 145 performs temperature dependent frequency stability calculation. FIG. 8 shows its operation.

Referring to FIGS. 2 and 8, the satellite-holdover mode switch 171 of the temperature characteristic processing unit 145 is connected to its terminal "a" for the satellite locked mode, in response to the mode switching signal 181. The temperature model calculator 165 initializes the covariance matrix and the frequency stability estimate (step 311). The switching controller 173 determines whether the clock value Clk represented by the frequency count signal 147 is equal to p (the update rate for temperature model)× the predetermined maximum value Int.

If Clk=p×Int (positive determination at step 312), the switching controller 173 controls the temperature model update switch 169 to be connected to its terminal "a". The subtractor 161 subtracts the aging model output of the aging model output signal 154 from the raw input data represented by the filter input signal 148. The subtracted data represented by the subtracted signal 162 is filtered by the IIRF 163. The IIRF filtered output data is fed to the temperature model calculator 165. The temperature model calculator 165 updates the temperature model in accordance with the subtracted data and averages time of the subtracted data (step 313).

If Clk is not p×Int (negative determination at step 312), the switching controller 173 controls the temperature model update switch 169 to be connected to its terminal "b". The temperature model output signal 166 of the temperature model calculator 165 is fed back to the input of the temperature model calculator 165. Thus, the temperature model calculator 165 updates the temperature model by the last (or the preceding) predicted value (step 314).

After performing step 313 or step 314, the temperature model calculator 165 computes the Kalman gain K (step 315) and the frequency stability estimate is calculated (step 316).

The sensed temperature relating to the OCXO 119 is provided to the temperature model calculator 165 and the turnover temperature logic unit 167 by the temperature signal 131. The turnover temperature logic unit 167 calculates or detects the turnover temperature, in accordance with the IIRF filtered value, the averaged time calculated at step 313 and the sensed temperature (step 317). The calculated turnover temperature is provided to the temperature model calculator 165 from the turnover temperature logic unit 167. The temperature model calculator 165 calculates the temperature step ΔT (step 318).

In accordance with the calculated turnover temperature, the temperature step and the IIRF filtered value, the temperature model calculator 165 updates the temperature model thereof. Thus, the transition matrix is built (step 319) and next frequency estimate and next covariance matrix are predicted (step 320). The transition matrix is shown above as the transition matrix formulation A. Then, step 314–320 are repeated.

After step 320, the updated temperature model output is provided by the temperature model calculator 165 as the temperature model output signal 166. The temperature model output signal 166 represents the output temperature dependent frequency stability estimate (step 321).

The aging model output signal 154 and the temperature model output signal 166 are fed to the adder 177 to be added, so that data of both signals is added to provide the compensation processed signal 179 to the DAC value selection switch 197. In a case of the connection to terminal "D", the compensation processed signal 179, as the selected value signal 198, is fed to the DAC 117. In response to the compensation processed signal 179, the DAC 117 provides the EFC input signal 118 in accordance with the output aging dependent frequency stability estimate and the output temperature dependency frequency stability estimate. Thus, the OCXO 119 is controlled by both the aging and temperature dependent frequency estimates.

Figure 9:
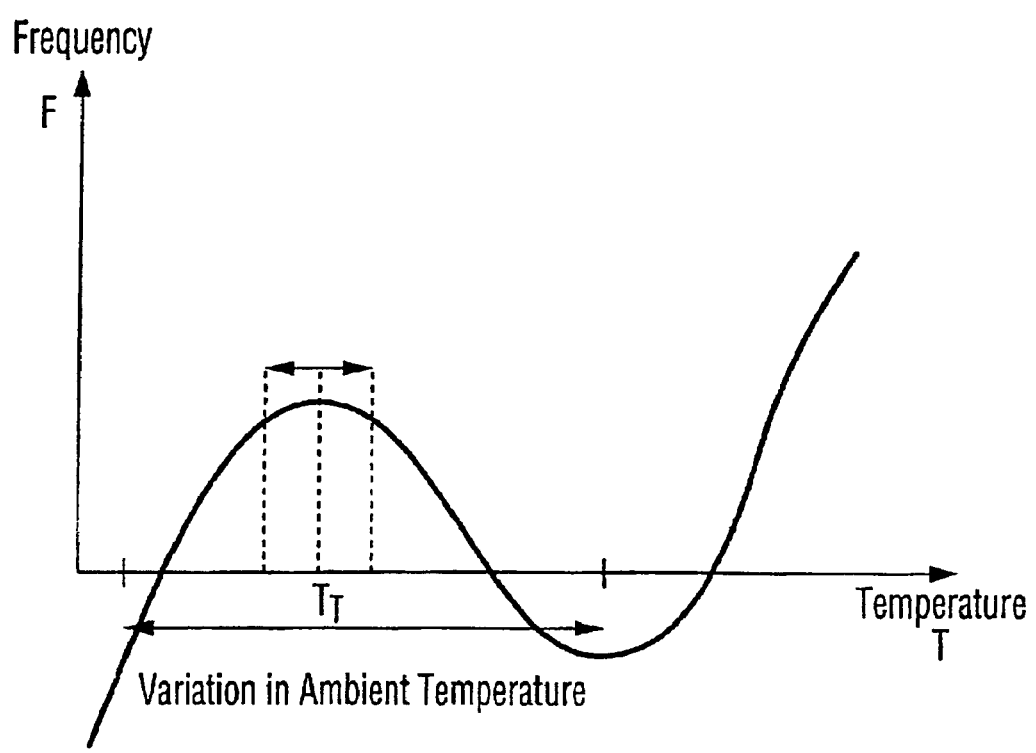
FIG. 9 depicts a form of the frequency (F) vs. temperature (T) characteristic for an SC cut crystal used in an oscillator included in the reference timing signal apparatus shown in FIG. 2.

In a case where the OCXO 119 uses an SC cut crystal, the form of its frequency (F) vs. temperature (T) characteristic is taken as shown in FIG. 9. The form of the F-T characteristic is taken in the temperature range experienced by a crystal due to ovenization. As the turnover temperature $T_T$ is passed the dF/dT slope changes sign (from + to − or from −to +). It is necessary to detect such a distinction of the temperature characteristic as the turnover temperature and then apply it to the transition matrix of the Kalman filter to ensure the Kalman filter gradient dF/dt changes sign. It is noted that dF/dT is the rate of change in frequency with temperature and dF/dt is the rate of change in frequency with time.

Figure 10:
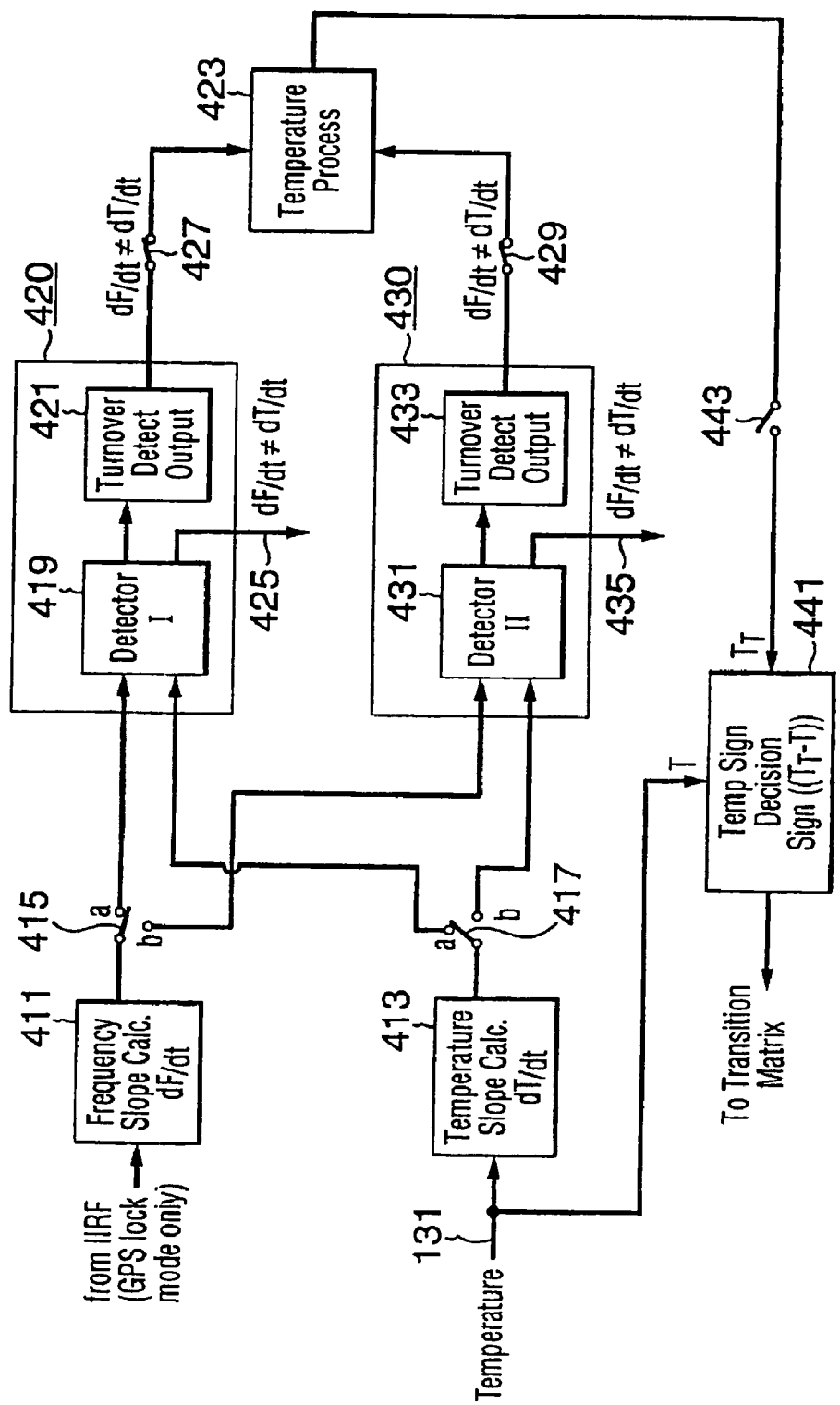
FIG. 10 shows a detail of a turnover temperature calculation unit included in the reference timing signal apparatus shown in FIG. 2.
Figure 11:
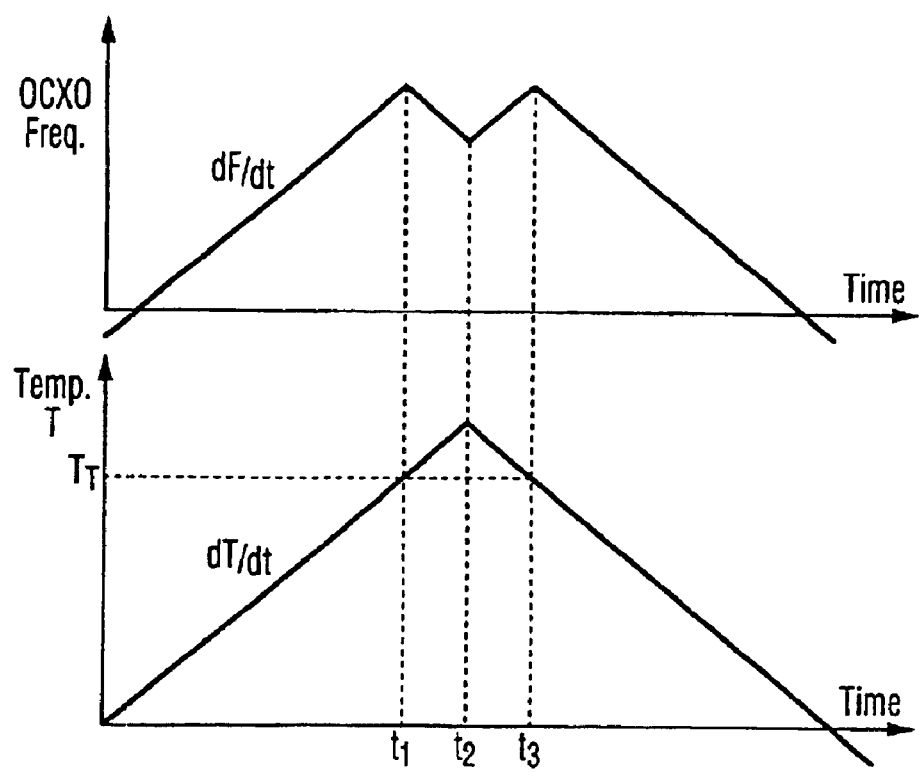
FIG. 11 shows the characteristic of the rates dF/dt and dT/dt for detecting the turnover temperature in the satellite locked mode.

FIG. 10 shows the turnover temperature logic unit 167 shown in FIG. 2. FIG. 11 shows the characteristic of the rates dF/dt and dT/dt for detecting the turnover temperature in the satellite locked mode.

Referring to FIGS. 2, 10 and 11, the IIRF filtered value from the IIRF 163 is fed to a frequency slope calculator 411 in the satellite locked mode only to calculate a frequency slope dF/dt. The sensed temperature (T) represented by the temperature signal 131 is provided to a temperature slope calculator 413 to calculate a temperature slope dT/dt. When a detector selection switch 415 and another detector selection switch 417 are connected to their terminals "a", the frequency slope dF/dt and the temperature slope dT/dt are provided to a slope detector 419 of a turnover detector 420.

If the sign of dF/dt is equal to the sign of dT/dt, no turnover temperature will be detected (e.g., prior to time $t_1$ as shown in FIG. 11). If the sign of dF/dt is not equal to the sign of dT/dt, a turnover temperature $T_T$ will be detected (e.g., between times $t_1$ and $t_2$, between times $t_2$ and $t_3$). A detection output unit 421 provides a turnover signal to a temperature processor 423 through a satellite locked mode switch 427. The satellite locked mode switch 427 is on (closed) in the satellite locked mode only. The slope detector 419 provides an activation signal 425.

In response to the activation signal 425, the detector selection switch 415 and the detector selection switch 417 switch their connections to their terminals "b" to activate a turnover detector 430. The outputs dF/dt and dT/dt from the frequency slope calculator 411 and the temperature slope calculator 413 are fed to a slope detector 431 of the turnover detector 430. If the sign of dF/dt is equal to the sign of dT/dt, the turnover temperature $T_T$ will be detected. A turnover detection output unit 433 provides a turnover signal to the temperature processor 423 through a satellite locked mode switch 429. The satellite locked mode switch 429 is on (closed) in the satellite locked mode only. The slope detector 431 provides an activation signal 435.

In response to the turnover signals from the turnover detection output unit 421 and the turnover detection output unit 433, the temperature processor 423 holds the input temperature in variable turnover temperature and in moving average filter. In response to the activation signal 435, the detector selection switch 415 and the detector selection switch 417 switch their connections to their terminals "a" to activate the turnover detector 420.

A holdover mode switch 443 is on (closed) in the holdover mode only and thus, no temperature processed signal from the temperature processor 423 is provided to a temperature sign detector 441 in the satellite locked mode. In accordance with the temperature T, the temperature sign detector 441 detects the temperature sign $S_T$ and provides it to the temperature model calculator 165. The sign $S_T$ is used to build the transition matrix of the temperature model by the temperature model calculator 165 (step 319 in FIG. 8).

Referring to FIGS. 2 and 10, when the base station loses contact with satellite, the satellite generated timing signal is unavailable to the PLL and the compensation processor 120. The PLL needs to operate in the holdover mode during the period of lacking of the satellite-generated timing signal, so as to provide the base station reference timing signal 127. In the holdover mode, the OCXO 119 operates without external frequency reference, the frequency of which is controlled by the steering voltage, in accordance with the characteristics of the aging and temperature models of the Kalman filters.

In the holdover mode, the satellite-holdover mode switch 157 of the aging characteristic processing unit 143 and the satellite-holdover mode switch 171 of the temperature characteristic processing unit 145 are connected to their terminals "b". The aging model output signal 154 of the aging characteristic processing unit 143 is fed back to its input terminal through the satellite-holdover mode switch 157 and the temperature model output signal 166 is fed back to its input terminal through the satellite-holdover mode switch 171. The satellite locked mode switches 427 and 429 are off (open) and thus, the temperature processor 423 does not perform new processing.

The holdover mode switch 443 (shown in FIG. 10) of the turnover temperature logic unit 167 is on (closed) and thus, temperature processed signal from the temperature processor 423 is provided to the temperature sign detector 441 which provides an output sign $S_T$ to the temperature model calculator 165, in accordance with the temperature processed signal from the temperature processor 423 and the temperature T. The sign $S_T$ is used to build the transition matrix of the temperature model by the temperature model calculator 165.

Figure 12:
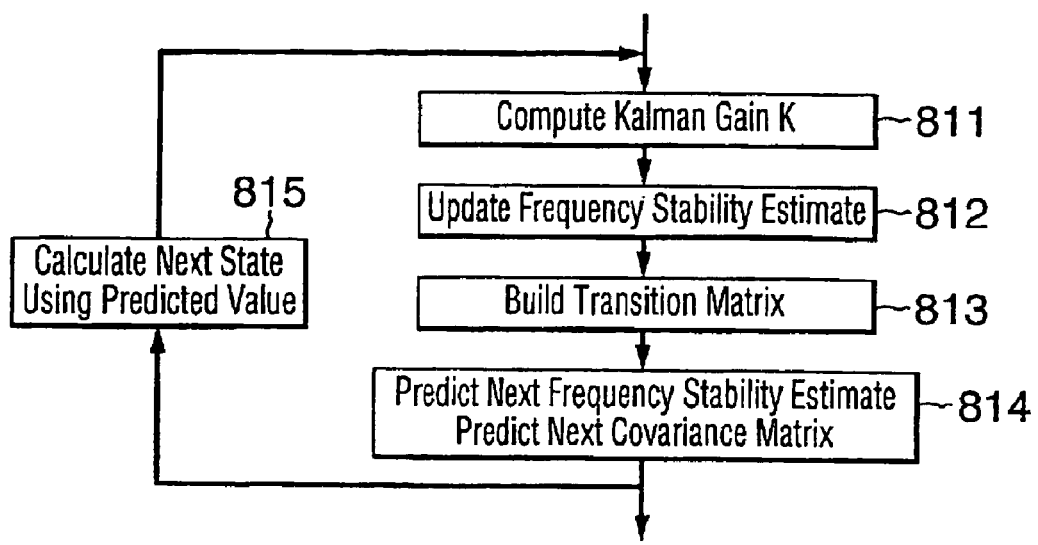
FIG. 12 is a flowchart showing the operation of the aging dependent frequency stability calculator in the holdover mode.

FIG. 12 shows the aging dependent frequency stability calculation in the holdover mode. Referring to FIGS. 2 and 12, the aging model calculator 153 of the aging characteristic processing unit 143 uses covariance matrix and frequency stability estimates predicted by using the adaptive algorithm. Prior to the holdover mode, the aging model calculator 153 of the aging characteristic processing unit 143 set its covariance matrix and frequency stability estimates, in the satellite locked mode.

The aging model calculator 153 computes the Kalman gain K (step 811). The frequency stability estimate is updated (step 812). The transition matrix is built (step 813). The transition matrix is shown above as the transition matrix formulation A. The transition matrix contains the state update equations which when applied to the current state generate the next predicted state. The next frequency stability estimate and next covariance matrix are predicted (step 814).

Next state is calculated using the predicted values (step 815) and steps 811–814 are repeated. In accordance with the predicted next frequency stability estimate and covariance matrix, the aging dependent frequency estimate is provided by the aging model calculator 153. Thus, the aging model calculator 153 uses the predicted covariance matrix and frequency stability estimates obtained in step 814. The aging dependent frequency estimate is represented by the aging model output signal 154 from the aging characteristic processing unit 143.

Figure 13:
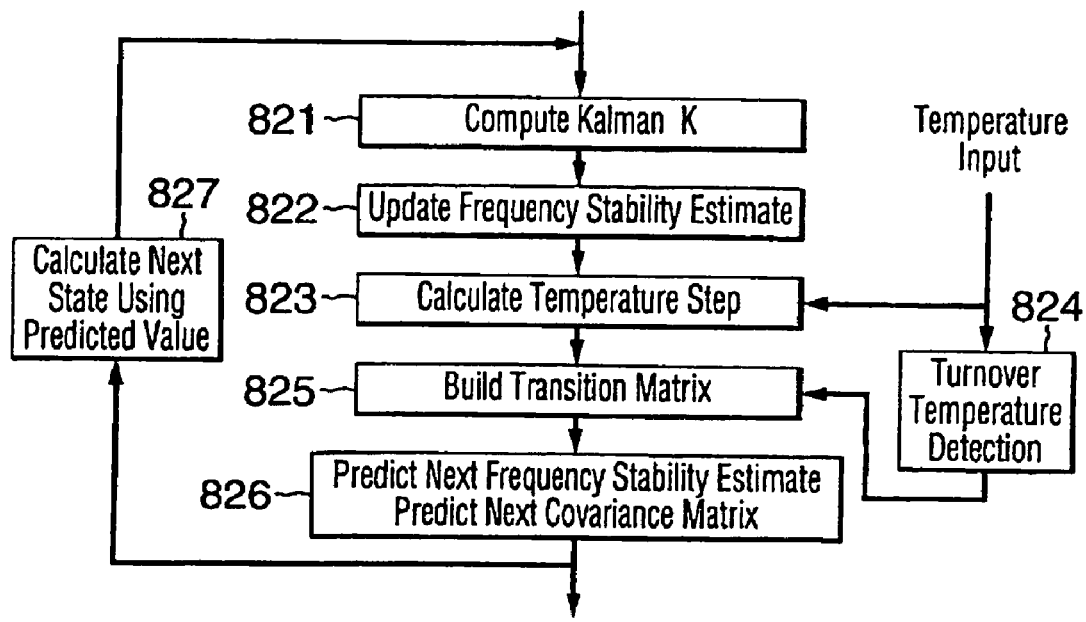
FIG. 13 is a flowchart showing the operation of the temperature dependent frequency stability calculator in the holdover mode.

FIG. 13 shows the temperature dependent frequency stability calculation in the holdover mode. Referring to FIGS. 2, 10 and 13, the temperature model calculator 165 of the temperature characteristic processing unit 145 uses covariance matrix and frequency stability estimate predicted by using the adaptive algorithm. Prior to the holdover mode, the temperature model calculator 165 of the temperature characteristic processing unit 145 set its covariance matrix and frequency stability estimates, in the satellite locked mode.

The temperature model calculator 165 computes the Kalman gain K (step 821). The frequency stability estimate is updated (step 822). The sensed temperature from the temperature sensor 129 is fed to the temperature model calculator 165 by the temperature signal 131. The temperature model calculator 165 calculates the temperature step ΔT (step 823).

In accordance with the temperature T, the turnover temperature logic unit 167 calculates or detects the turnover temperature $T_T$ (step 824). The holdover mode switch 443 shown in FIG. 10 is on in the holdover mode and the turnover temperature $T_T$ is provided from the temperature processor 423 to the temperature sign detector 441. The temperature sign detector 441 determines the sign of the difference between the turnover temperature $T_T$ and the sensed temperature T, ($T_T$–T), and the weighting term $V_T$ is detected thereby.

In response to the calculated temperature and the turnover temperature detection, the temperature model calculator 165 builds the transition matrix (step 825) and applies the sign detected by the temperature sign detector 441 to the weighting factor $V_T$ in the temperature model by multiplying $V_T$ by the turnover temperature sign.

Next frequency stability estimate and next covariance matrix are predicted (step 826). Thereafter, the next state is calculated using the predicted values (step 827) and steps 821–826 are repeated. After step 826 is performed, the temperature dependent frequency estimate is provided. Thus, the temperature model calculator 165 uses the predicted covariance matrix and frequency stability estimate obtained in step 826. In accordance with the predicted next frequency stability estimate and covariance matrix, the temperature dependent frequency estimate is provided by the temperature model calculator 165.

The aging dependent frequency estimate represented by the aging model output signal 154 from the aging characteristic processing unit 143 and the temperature dependent frequency estimate represented by the temperature model output signal 166 from the temperature characteristic processing unit 145 are fed to the adder 177. The compensation processed signal 179 from the adder 177 includes both the aging and temperature dependent estimates which are provided to the DAC 117 to control the frequency of the OCXO 119. Thus, the predicted frequency values generated in accordance with the updated model provide the necessary reference for compensation of the OCXO 119. In the holdover mode, temperature input values are continuously available to the compensation algorithm and it self-propagates the temperature model to be updated. The updated model is highly accurate as a result of the frequency updates during the locked period.

Figure 14:
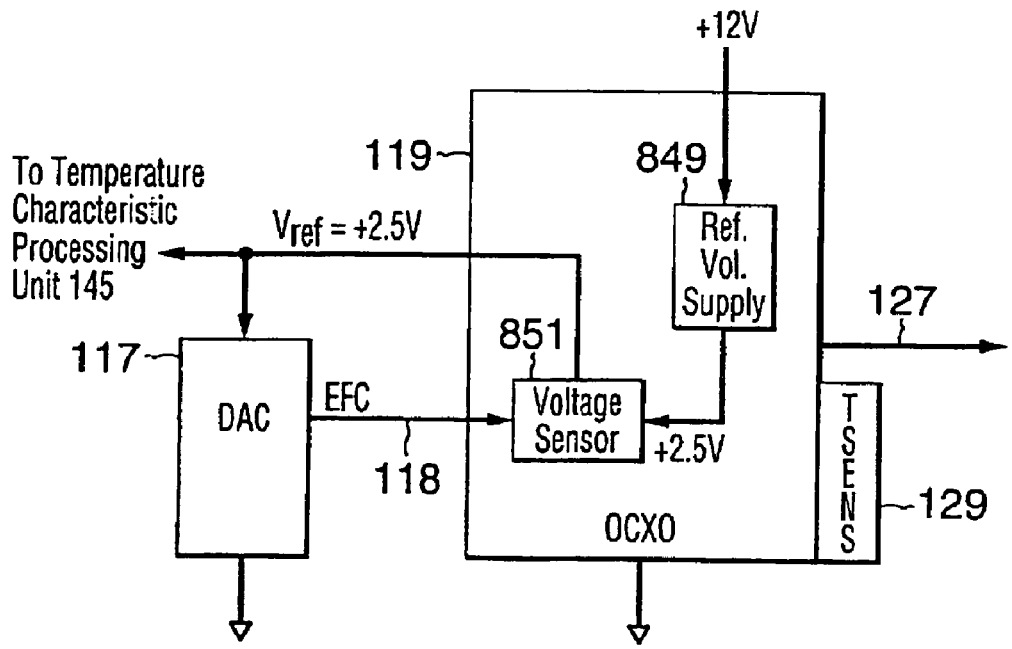
FIG. 14 is a block diagram which depicts a voltage sensor in an oven-controlled crystal oscillator (OCXO) for providing a reference voltage to a digital-to-analog converter (DAC) shown in FIG. 2.

Another element of the frequency dependent stability is the power supply voltage of the OCXO 119. FIG. 14 shows the OCXO 119 for providing a reference voltage to the DAC 117. In FIG. 14, a supply voltage (e.g., +12 volts) is provided to the OCXO 119 for its operation. A reference voltage supply unit 849 included in the OCXO 119 provides an ovenized voltage (e.g., +2.5 volts) which is sensed by a voltage sensor 851 which in turn provides an ovenized reference voltage $V_{ref}$ to the DAC 117. This reference voltage $V_{ref}$ is fed to the temperature model calculator 165 of the temperature characteristic processing unit 145 shown in FIG. 2. The temperature model calculator 165 calculates the temperature model in accordance with the voltage, among others. Thus, the frequency stability is achieved against the variation of the power supply voltage over time.

Figure 15:
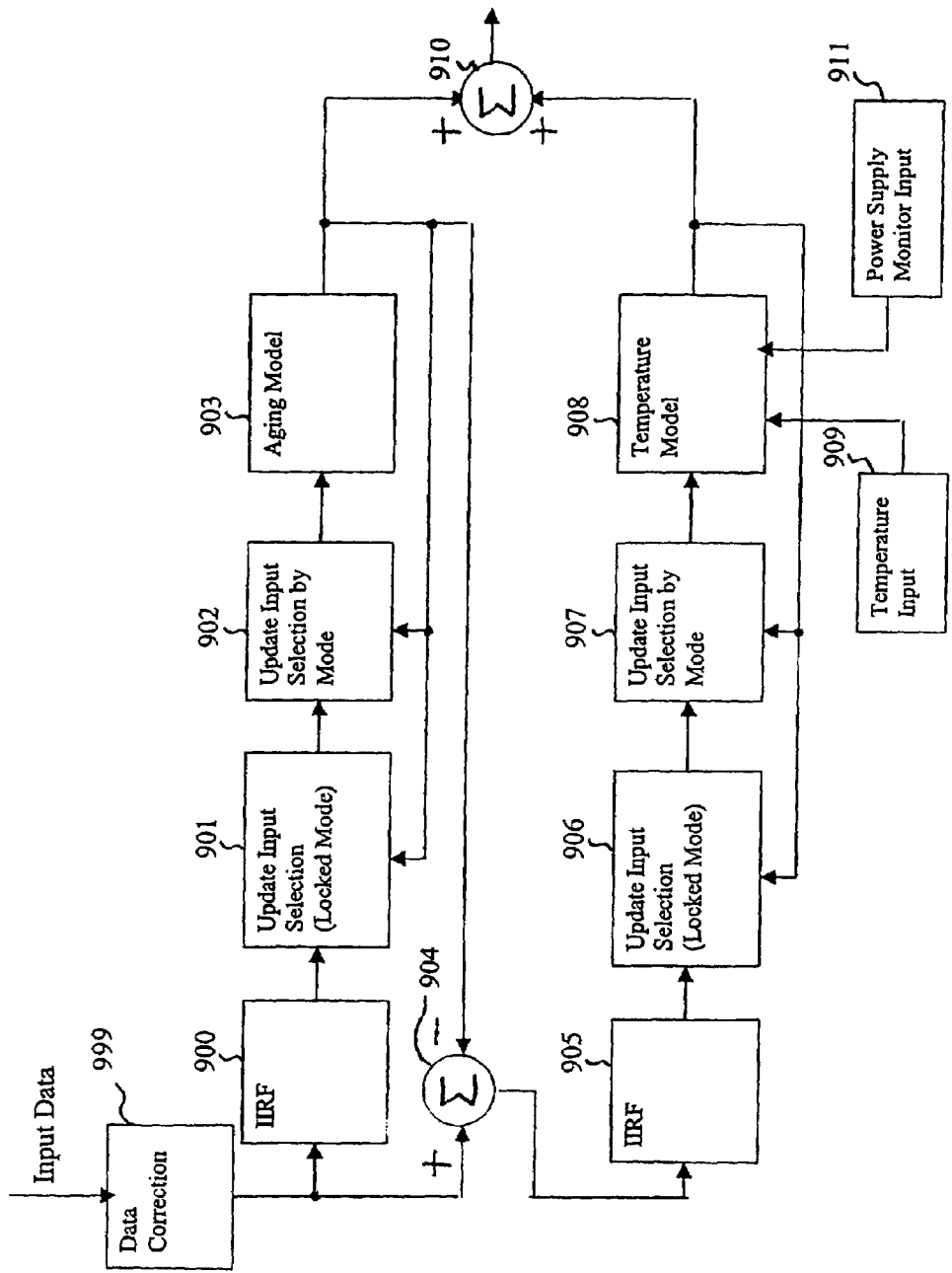
FIG. 15 illustrates the function of another embodiment according to the present invention.

FIG. 15 illustrates the function of another embodiment according to the present invention, wherein the frequency dependent stability of power supply voltage is implemented. The function of each block shown in FIG. 15 corresponds to that of each of block and unit shown in FIGS. 2, 10 and 14.

Referring to FIG. 15, a raw input data of the frequency of an oscillator (not shown) is fed to a data correction processor 999 for data correction from error. Corrected output data from the data correction processor 999 is fed to an IIRF 900 which in turn provides its IIRF filtered output data to a locked-mode input selector 901. The locked-mode input selector 901 selects its input data and its selected data is fed to a satellite-holdover input selector 902 which provides selected data, in accordance with a mode, to an aging model calculator 903.

In the satellite locked mode, the data selected by the locked-mode input selector 901 is fed to the aging model calculator 903. The aging model calculator 903 calculates Kalman filter function values in accordance with the input data and updates an aging model thereof, so that the future frequency state of the oscillator is predicted from the updated model. The aging model relates to the aging characteristic of the oscillator. In accordance with the updated model, output data is fed from the output of the aging model calculator 903 to the locked-mode input selector 901 and the satellite-holdover input selector 902. In the event that the aging model needs to be periodically updated by its preceding state, the locked-mode input selector 901 selects the output data of the aging model calculator 903 as an input data, so that the output data is fed back to the input of the aging model calculator 903. Accordingly, the aging model is updated by the preceding state.

In the holdover mode, the input data is unavailable and the satellite-holdover input selector 902 selects the output data of the aging model calculator 903 and feeds it back to the input thereof, so that the aging model of the aging model calculator 903 is updated in accordance with its preceding state in the holdover period.

The corrected data is subtracted by the output data of the aging model calculator 903 in a subtractor 904 and the subtracted data is fed to an IIRF 905. The IIRF filtered output data is fed to a locked-mode input selector 906. The locked-mode input selector 906 selects update input data and its selected data is fed to a satellite-holdover input selector 907 which provides selected data, in accordance with a mode, to a temperature model calculator 908.

In the satellite locked mode, the data selected by the locked-mode input selector 906 is fed to the temperature model calculator 908. Also, a temperature sensor 909 provides the temperature model calculator 908 with a temperature input data that is in relation to the oscillator and a power supply voltage sensor 911 provides the temperature model calculator 908 with a power supply monitor input. The temperature model calculator 908 calculates Kalman filter function values in accordance with the input data, the temperature input and the power supply voltage input and updates a temperature model thereof, so that the future frequency state of the oscillator is predicted from the updated model.

The temperature model relates the temperature characteristic of the oscillator. In accordance with the updated model, output data is fed from the output of the temperature model calculator 908 to the locked-mode input selector 906 and the satellite-holdover input selector 907. In the event that the temperature needs to be periodically updated by its preceding state, the locked-mode input selector 906 selects the output data of the temperature model calculator 908 as an input data, so that the output data is fed back to the input of the temperature model calculator 908.

The temperature model is updated by the preceding state. In the holdover mode, the input data is unavailable and the satellite-holdover input selector 907 selects the output data of the temperature model calculator 908 and feeds it back to the input thereof, so that the temperature model of the temperature model calculator 908 is updated in accordance with the preceding state in the holdover period.

The output data of the aging model calculator 903 and the temperature model calculator 908 is fed to an adder 910 which in turn provides added data. The added data represents predicted frequency element in accordance with the aging, temperature and voltage characteristics. The predicted frequency dependent element is provided to the oscillator, so that the oscillator changes its oscillation frequency in accordance with the predicted frequency element, regardless of the satellite locked mode or the holdover mode. Therefore, the oscillation frequency is controlled in accordance with the models' elements updated by input data in the satellite-mode (a training period) and with the models' elements in the holdover mode, the elements having been updated in the training period.

The algorithm is extendable to any number of frequency perturbing variables. The algorithm can automatically determine the turnover temperature of the crystal oscillator and use this information to enhance tracking during holdover mode. Robust controller tolerance is achieved to variations in oscillator performance. The algorithm is adaptive to any drift pattern. There is no maintenance cost for the embedded algorithm. The algorithm model adaptively scales the order of the control model. Using the algorithm causes cost reduction in processors and memories.

The algorithm is robust against intermittent satellite visibility through the provision of a training timer algorithm which guarantees that the compensation processor algorithm is continuously trained for the training period (e.g., two hours), before the compensation processor algorithm is used to control the oscillation frequency.

In the above embodiment, the oscillator is a double ovened one and a Kalman filter is used as an adaptive filter in the aging and temperature models for updating their function elements to compensate the frequency dependency characteristics. However, a crystal oscillator without oven-control may be used as an oscillator. Other type of filters, predictors and compensation models may be used. An example of other adaptive filters is an h-infinite filter which may be used for the adaptive algorithm of the aging model calculator and the temperature model calculator 108, wherein the calculators calculate their filter function values.

The reference timing signal apparatus with a PLL may be applicable to any apparatus other than mobile base stations. The algorithm in the embodiments focused on the aging, temperature and voltage frequency dependent characteristics. However, there are other characteristics causing the long term perturbation of the frequency of oscillators.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A reference timing signal apparatus for providing a timing output signal, the reference timing signal apparatus comprising:

an oscillator for generating an oscillation output signal in response to a control component of an input control signal;

a difference detector for detecting a difference corresponding to a time difference between the oscillation output signal and an input reference timing signal when the input reference timing signal is available, thereby providing a difference signal;

an error calculator for calculating cumulative time error (CTE) in the difference signal over a given time period to provide a correction signal having correction data corresponding to the calculated CTE;

a processor for providing a frequency control value in accordance with the correction data and a frequency dependent element relating to the oscillator, the frequency dependent element being provided in accordance with a characteristic model that is updateable in accordance with the correction data when the input reference timing signal is available; and an oscillation controller for controlling the control component of the input control signal applied to the oscillator in accordance with the correction data provided by the error calculator and the frequency control value provided by the processor.

2. The reference timing signal apparatus of claim 1, wherein the processor includes:
a processing unit, for updating a parameter of the characteristic model, the parameter being changed in accordance with the correction data when the input reference timing signal is available and in accordance with a past parameter when the input reference timing signal is unavailable, respectively, the frequency control value being controlled in accordance with the updated parameter of the characteristic model.

3. The reference timing signal apparatus of claim 2, wherein the processing unit includes:
a first processing unit for providing a first characteristic signal in accordance with a first parameter of a first model included in the characteristic model, the first parameter relating to an aging characteristic of the oscillator, the first processing unit updating the first parameter in accordance with the correction data when the input reference timing signal is available and in accordance with a past parameter when the input reference timing signal is unavailable, respectively.

4. The reference timing signal apparatus of claim 3, wherein the processing unit further includes:
a second processing unit for providing a second characteristic signal in accordance with a second parameter of a second model of the characteristic model, the second parameter being related to a temperature characteristic of the oscillator, the second processing unit updating the second parameter:
(i) in accordance with the correction data, the first characteristic signal provided by the first processing unit and a temperature in relation to the oscillator, when the input reference timing signal is available; and:
(ii) in accordance with a past parameter when the input reference timing signal is unavailable,
the frequency control value being produced based on the updated first and second parameters.

5. The reference timing signal apparatus of claim 4, wherein:
each of the first and second processing units includes an adaptive filter, the first processing unit updating the first parameter of the first model using the adaptive filter thereof, the second processing unit updating the second parameter of the second model using the adaptive filter thereof.

6. The reference timing signal apparatus of claim 1, wherein the error calculator calculates the CTE over the given time period, the CTE occurring during a divided time period that is a division of the given time period.

7. The reference timing signal apparatus of claim 6, wherein the error calculator updates the cumulative error by a predetermined factor at a given time.

8. The reference timing signal apparatus of claim 7, wherein the divided time period is based on an update rate of the reference timing signal apparatus.

9. The reference timing signal apparatus of claim 1, wherein the oscillation controller includes:
a variable storage for storing the correction data provided by the error calculator, thereby providing previously stored correction data therefrom.

10. The reference timing signal apparatus of claim 9, wherein the oscillation controller further includes:
a selector for selecting the correction data provided by the error calculator, the previously stored correction data provided by the storage or the frequency control value provided by the processor to provide selected data.

11. The reference timing signal apparatus of claim 10, wherein the oscillation controller further includes:
a converter for converting the selected data into voltage representing the control component of the input control signal applied to the oscillator.

12. The reference timing signal apparatus of claim 11, wherein the converter includes:
a data conversion unit for converting bits of the selected data; and
a voltage generator for producing the voltage in response to the converted bits, the voltage representing the control component of the input control signal.

13. The reference timing signal apparatus of claim 10, further including a training controller for:
(i) causing the processing unit to update the parameter of the characteristic model; and
(ii) controlling the selection of the selector, so that the calculated correction data, the frequency control value and the previously stored correction data are selected in first, second and third selection mode, respectively.

14. The reference timing signal apparatus of claim 13, wherein:
the first selection mode corresponds to a mode in which the input reference timing signal is available and the control component of the input control signal is controlled in response to the correction data;
the second selection mode corresponds to a mode in which the input reference timing signal is unavailable and the component of the input control signal is controlled in response to the frequency control value; and
the third selection mode corresponds to a mode in which the input reference timing signal is unavailable and the component of the input control signal is controlled in response to the previously stored correction data.

15. The reference timing signal apparatus of claim 13, wherein the processor further includes:
an error value applicator for applying the correction data represented by the control signal to the processing unit.

16. The reference timing signal apparatus of claim 15, wherein the error value applicator includes:
a training delay controller for delaying an application of the correction data to the processing unit for a given time period under control by the training controller.

17. The reference timing signal apparatus of claim 16, wherein the error value applicator further includes:
an initial value holder for acquiring an initial value of the correction data during a predetermined time period after the delayed application under control by the training controller and for holding the acquired initial value, thereby providing the held initial value continuously, the processing unit receiving a combination value of the correction data and the held initial value.

18. The reference timing signal apparatus of claim 17, wherein the processing unit includes:
an aging processing unit for providing an aging characteristic signal in accordance with a first parameter of a first model included in the characteristic model, the first parameter relating to an aging characteristic of the oscillator, the first processing unit updating the first parameter in accordance with the correction data when the input reference timing signal is available and in accordance with a past parameter when the input reference timing signal is unavailable, respectively; and a value combiner for combining a value representing by the aging characteristic signal from the first processing unit and the initial value held in the initial value holder to provide a first characteristic signal.

19. The reference timing signal apparatus of claim 18, wherein the processing unit further includes:
a second processing unit for providing a second characteristic signal in accordance with a second parameter of a second model of the characteristic model, the second parameter being related to a temperature characteristic of the oscillator, the second processing unit updating the second parameter, in accordance with the correction data, the first characteristic signal and a temperature in relation to the oscillator.

20. The reference timing signal apparatus of claim 1, further including:
a frequency multiplier for multiplying the frequency of the oscillation output signal, a frequency multiplied signal being provided to the difference detector.

21. The reference timing signal apparatus of claim 20, wherein the difference detector detects the difference corresponding to the time difference between the oscillation output signal and the input reference timing signal based on the cycles of the multiplied frequency, thereby providing the difference signal of the cycles of the multiplied frequency.

22. The reference timing signal apparatus of claim 21, wherein the error calculator calculates the CTE based on the cycles of the multiplied frequency provided by the difference detector.

23. The reference timing signal apparatus of claim 22, wherein the error calculator calculates a correction value based on a moving average of past correction values and the calculated CTE.

24. The reference timing signal apparatus of claim 10, wherein the training controller controls the processing unit, so that it updates the parameter of the characteristic model thereof when the input reference timing signal is available.

25. The reference timing signal apparatus of claim 10, wherein the training controller controls the processing unit, so that it continuously updates the parameter of the characteristic model thereof during a given training time period, when the input reference timing signal is available.

26. The reference timing signal apparatus of claim 10, wherein the training controller controls the processing unit, so that it delays the updating of the parameter of the characteristic model thereof by a given delay time period, after the reference timing signal apparatus is phase-locked.

27. A method for providing a timing output signal, comprising the steps of:
generating an oscillation output signal in response to a control component of an input control signal;
detecting a difference corresponding to a time difference between the oscillation output signal and an input reference timing signal when the input reference timing signal is available;
calculating phase error in a detected difference over a given time period to provide a calculated phase error;
changing the control component of the input control signal in accordance with the calculated phase error and a frequency dependent element relating to the oscillator;
providing the frequency dependent element in accordance with a characteristic model that is updateable in accordance with the calculated phase error when the input reference timing signal is available,
wherein a frequency of the oscillation output signal generated by the oscillator is controlled in accordance with the control component of the input control signal, the timing output signal being provided in accordance with the oscillation output signal,
whereby the timing output signal is provided when the input reference timing signal is unavailable.

28. The method of claim 27, wherein the step of providing the frequency dependent element includes the steps of:
providing a first characteristic signal in accordance with a first parameter of a first model included in the characteristic model, the first parameter relating to an aging characteristic of the oscillator, the first parameter being updated in accordance with the calculated phase error when the input reference timing signal is available and in accordance with a past parameter when the input reference timing signal is unavailable, respectively; and
providing a second characteristic signal in accordance with a second parameter of a second model of the characteristic model, the second parameter relating to a temperature characteristic of the oscillator, the second parameter being updated:
(i) in accordance with the calculated phase error, the first characteristic signal and a temperature in relation to the oscillator, when the input reference timing signal is available; and
(ii) in accordance with a past parameter when the input reference timing signal is unavailable,
the frequency control value being produced based on the updated first and second parameters.

29. The method of claim 28, wherein:
the step of updating the first parameter includes the step of updating the first parameter of the first model using an adaptive filter; and
the step of updating the second parameter includes the step of updating the second parameter of the second model using an adaptive filter.

30. The method of claim 27, wherein the step of calculating phase error includes the step of:
calculating a cumulative time error (CTE) over the given time period, each of the phase error being one occurring during a divided time period that is a division of the given time period.

31. The method of claim 27, wherein the step of changing the control component of the input control signal includes the step of:
controlling the control component of the input control signal applied to the oscillator in accordance with the calculated CTE and a moving average of the past correction values,
a frequency of the oscillation output signal generated by the oscillator being controlled in accordance with the control component of the input control signal.

32. The method of claim 27, further including the steps of:
causing the parameter of the characteristic model to be updated; and
selecting the calculated phase error, the frequency control value and the previously stored phase error in first, second and third selection modes, respectively.

33. The method of claim 32, wherein the step of selecting includes the steps of:
performing the operation of the first selection mode while the input reference timing signal is available, so that the control component of the input control signal is controlled in response to the calculated phase error;
performing the operation of the second selection mode while the input reference timing signal is unavailable, so that the component of the input control signal is controlled in response to the frequency control value; and performing the operation of the third selection mode while the input reference timing signal is unavailable, so that the component of the input control signal is controlled in response to the previously stored phase error.

34. An apparatus for generating a reference signal for use in a cellular base station, the apparatus comprising:
- a receiver for generating an input reference timing signal when a cellular signal is available;
- an oscillator for generating an oscillation output signal in response to a control component of an input control signal;
- a difference detector for detecting a difference corresponding to a time difference between the oscillation output signal and the input reference timing signal when the input reference timing signal is available, thereby providing a difference signal;
- an error calculator for calculating phase error in the difference signal over a given time period to provide a calculated phase error;
- a processor for providing a frequency control value in accordance with the calculated phase error and a frequency dependent element relating to the oscillator, the frequency dependent element being provided in accordance with a characteristic model that is updateable in accordance with the calculated phase error when the input reference timing signal is available; and
- an oscillation controller for controlling the control component of the input control signal applied to the oscillator in accordance with the calculated phase error provided by the error calculator and the frequency control value provided by the processor.

35. The apparatus of claim 34, wherein the processor includes:
- a first processing unit for providing a first characteristic signal in accordance with a first parameter of a first model included in the characteristic model, the first parameter relating to an aging characteristic of the oscillator, the first processing unit updating the first parameter in accordance with the calculated phase error when the input reference timing signal is available and in accordance with a past parameter when the input reference timing signal is unavailable, respectively; and
- a second processing unit for providing a second characteristic signal in accordance with a second parameter of a second model of the characteristic model, the second parameter relating to a temperature characteristic of the oscillator, the second processing unit updating the second parameter:
  (i) in accordance with the calculated phase error, the first characteristic signal provided by the first processing unit and a temperature in relation to the oscillator, when the input reference timing signal is available; and
  (ii) in accordance with a past parameter when the input reference timing signal is unavailable, the frequency control value being produced based on the updated first and second parameters.

36. The apparatus of claim 35, wherein the error calculator a cumulative time error (CTE) over the given time period, each of the phase error being one occurring during a divided time period that is a division of the given time period.

37. The apparatus of claim 35, wherein the error calculator updates the cumulative error by a predetermined factor at a given time, the divided time period being based on an update rate of the apparatus.

38. The apparatus of claim 35, wherein the oscillation controller includes:
- a selector for selecting the calculated phase error provided by the error calculator, the previously stored phase error provided by the storage or the frequency control value provided by the processor to provide selected data.

39. The apparatus of claim 38, further including a training controller for:
  (i) causing the processing unit to update the parameter of the characteristic model; and
  (ii) controlling the selection of the selector, so that the calculated phase error, the frequency control value and the previously stored phase error are selected in first, second and third selection mode, respectively.

40. The apparatus of claim 39, wherein the training controller controls the selection of the selector:
- in the first selection mode while the input reference timing signal is available, so that the control component of the input control signal is controlled in response to the calculated phase error;
- in the second selection mode while the input reference timing signal is unavailable, so that the component of the input control signal is controlled in response to the frequency control value; and
- in the third selection mode while the input reference timing signal is unavailable, so that the component of the input control signal is controlled in response to the previously stored phase error.

* * * * *